(12) United States Patent
Nakanishi et al.

(10) Patent No.: US 8,717,796 B2
(45) Date of Patent: May 6, 2014

(54) MEMORY DIES, STACKED MEMORIES, MEMORY DEVICES AND METHODS

(71) Applicant: Micron Technology, Inc., Boise, ID (US)

(72) Inventors: Takuya Nakanishi, Tsukuba (JP); Yutaka Ito, Tsukuba (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/860,161

(22) Filed: Apr. 10, 2013

(65) Prior Publication Data

US 2013/0229847 A1 Sep. 5, 2013

Related U.S. Application Data

(62) Division of application No. 12/704,354, filed on Feb. 11, 2010, now Pat. No. 8,437,163.

(51) Int. Cl.
*G11C 5/00* (2006.01)
*G11C 7/00* (2006.01)
*G11C 8/00* (2006.01)

(52) U.S. Cl.
USPC .......... 365/52; 365/189.09; 365/189.11; 365/230.03; 365/230.06

(58) Field of Classification Search
USPC ........ 365/51, 52, 63, 189.11, 194, 226, 365/230.03, 230.06, 189.09
See application file for complete search history.

(56) References Cited

U.S. PATENT DOCUMENTS

| | | | |
|---|---|---|---|
| 3,704,455 A | 11/1972 | Scarbrough | |
| 5,943,254 A | 8/1999 | Bakeman, Jr. et al. | |
| 6,448,661 B1 | 9/2002 | Kim et al. | |
| 6,720,643 B1 | 4/2004 | Fox et al. | |
| 6,741,513 B2 | 5/2004 | Honigschmid et al. | |
| 6,971,175 B2 | 12/2005 | Savoy et al. | |
| 6,991,964 B2 | 1/2006 | Matsuo et al. | |
| 7,111,149 B2 | 9/2006 | Eilert | |
| 7,362,637 B2 | 4/2008 | Regev et al. | |
| 7,548,444 B2 | 6/2009 | Matsui et al. | |
| 7,564,263 B2 | 7/2009 | Walker et al. | |
| 7,710,754 B2 * | 5/2010 | Kao | 365/51 |
| 7,791,918 B2 | 9/2010 | Ruby | |
| 7,791,919 B2 | 9/2010 | Shimizu | |
| 7,822,910 B2 | 10/2010 | Kao | |
| 7,869,240 B2 | 1/2011 | Shimizu et al. | |
| 7,916,511 B2 | 3/2011 | Park | |
| 7,952,184 B2 | 5/2011 | Farrar et al. | |
| 7,965,531 B2 | 6/2011 | Matsui et al. | |
| 8,031,505 B2 | 10/2011 | Kang et al. | |
| 2002/0109236 A1 | 8/2002 | Kim et al. | |

(Continued)

OTHER PUBLICATIONS

Supplementary European Search Report for European Application No. 11742804.5 dated Jul. 29, 2013, 7 pages.

*Primary Examiner* — Trong Phan
(74) *Attorney, Agent, or Firm* — Perkins Coie LLP

(57) ABSTRACT

Memory die, stacks of memory dies, memory devices and methods, such as those to construct and operate such die, stacks and/or memory devices are provided. One such memory die includes an identification configured to be selectively coupled to an external select connection node depending on how the die is arranged in a stack. The identification circuit can determine an identification of its respective memory die responsive to how, if coupled, the identification circuit is coupled to the external select connection node.

18 Claims, 16 Drawing Sheets

(56) References Cited

U.S. PATENT DOCUMENTS

| | | |
|---|---|---|
| 2005/0082664 A1 | 4/2005 | Funaba et al. |
| 2005/0289269 A1 | 12/2005 | Nakayama et al. |
| 2006/0267212 A1 | 11/2006 | Shibata et al. |
| 2006/0294335 A1 | 12/2006 | Vogt |
| 2008/0220565 A1 | 9/2008 | Hsu et al. |
| 2009/0147557 A1 | 6/2009 | Lahtinen et al. |
| 2011/0194326 A1 | 8/2011 | Nakanishi et al. |

\* cited by examiner

MEMORY DIES, STACKED MEMORIES, MEMORY DEVICES AND METHODS

CROSS-REFERENCE TO RELATED APPLICATION

This application is a divisional of U.S. application Ser. No. 12/704,354 filed Feb. 11, 2010, now U.S. Pat. No. 8,437,163, which is incorporated herein by reference in its entirety.

BACKGROUND

The market for electronic apparatus and systems is driving industry to higher operating speeds for processors and enhanced storage capacity in the devices operating with such processors. Concurrent with enhanced functionality and capacity of these electronic devices is increased complexity and consumption of power. Consumption of power can lead to depletion of power supply resources, increased operational costs, and performance degradation associated with heating and current flows in the devices.

BRIEF DESCRIPTION OF THE DRAWINGS

Embodiments of the invention are illustrated by way of example and not limitation in the figures of the accompanying drawings in which.

DETAILED DESCRIPTION

The following detailed description refers to the accompanying drawings that show, by way of illustration, and not limitation, various embodiments of the invention. These embodiments are described in sufficient detail to enable those skilled in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Figure 1:
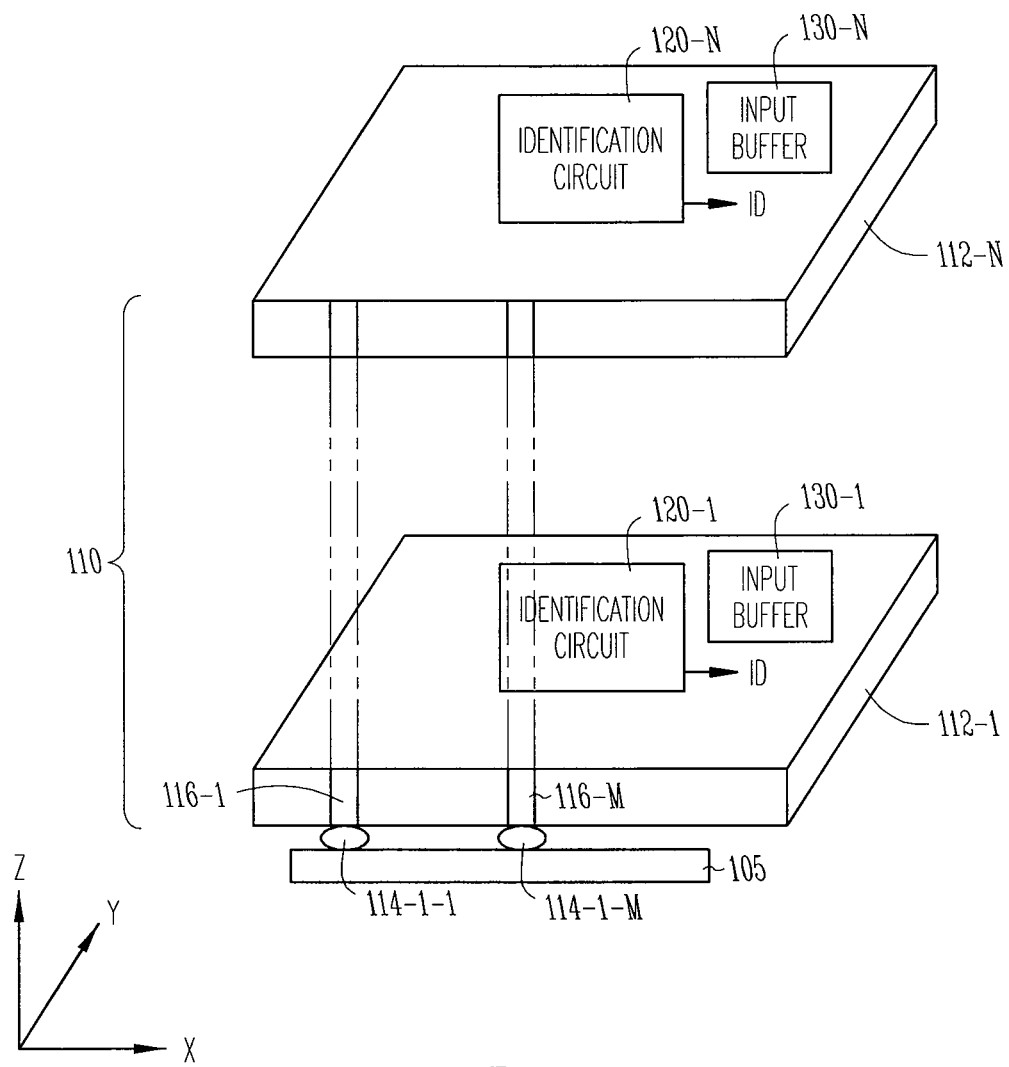
FIG. 1 shows a block diagram of a memory device including a stack of memory dies, according to various example embodiments.

FIG. 1 shows a block diagram of a memory device including a stack 110 of memory dies 112-1 . . . 112-N. Stack 110 includes a plurality of external "select" (e.g., chip-select) connection nodes 114-1-1 . . . 114-1-M. A "connection node" can be, for example, a discrete conductive structure (or structures), such as a terminal, pin, wire, conductive ball, solder joint, pad, metal layer (whether patterned or not) or other similar structure, or can simply be a point of interface between two conductive structures (e.g., such as where two conductively coupled through-substrate vias meet). Such connection nodes can, for example, be used to conductively couple a die to something else (e.g., another die or some other structure).

A "chip-select related" connection node can be a connection node that is configured to potentially receive a chip-select signal, depending on how a die is arranged in a stack. A "chip-select" connection node can be a connection node that, upon arrangement of a die in a stack, is configured to receive a chip-select signal. "External" connection nodes, such as chip-select connection nodes 114-1-1, . . . , 114-1-M, can, for example, be used to conductively couple a stack, such as stack 110, to something else, such as a structure 105 that is external to a stack of memory dies. An external structure 105 can be, for example, a bus providing a variety of signals to the stack of memory dies. The external structure 105 can also be, for example, a logic die or other interface structure that provides an interface function between the stack of memory dies and one or more processors or other external device(s).

Each memory die 112-i (i=1 . . . N) of the stack 110 can have (e.g., can include) a corresponding identification circuit 120-i (i=1 . . . N), respectively, which in at least some embodiments, can be coupled to an associated input buffer 130-i (i=1 . . . N) for chip-selection. An identification circuit 120-i on each memory die 112-i can be coupled (or not coupled) to one or more of a plurality of external chip-select connection nodes 114-1-1 . . . 114-1-M. An identification circuit 120-i on each memory die 114-i can determine (e.g., detect) an identification (ID) of its respective memory die responsive to, for example, how the identification circuit is coupled to one or more of the plurality of external chip-select connection nodes 114-1-1 . . . 114-1-M (e.g., responsive to how many of the external chip-select connection nodes it is coupled to, if any). In various embodiments, N can equal M.

An identification circuit 120-i can be coupled to one or more of the external chip-select connection nodes 114-1-1 . . . 114-1-M via through-substrate vias (TSVs) 116-1 . . . 116-M in its respective memory die 112-i. A TSV can comprise conductive material that essentially extends from one surface of a die (e.g., one surface of a substrate of the die) to the opposite surface (e.g., of the substrate of the die). However, it is noted that a TSV need not necessarily pass entirely through a particular substrate/die. In a silicon substrate or a silicon-based substrate, these through-substrate vias are referred to as through-silicon vias.

TSVs can interconnect the die of a stack to an underlying or overlying external structure, such as a bus system, logic die, or other interface structure, in the z-direction. Thousands or more of these TSVs can form a part of transmission paths that can be implemented with these dies and an underlying or overlying external structure with at least equivalent transmission capabilities as if arranged on the same horizontal (x-y) plane. TSVs can be arranged to provide, depending on the application of such a 3-D integration, various combinations of data buses, address buses, control lines, and other communication paths. A TSV that couples to a chip-select related connection node is herein referred to as a chip-select related TSV, while a chip-select related TSV that is actually coupled to a chip-select connection node is herein referred to as a chip-select TSV.

In a mass production environment, it would be advantageous if each memory die 112 to be used in the stack 110 can essentially be the same product, e.g., if it can be formed using the same process and have the same design, regardless of how it is ultimately arranged in the stack. To help allow for that, an identification (ID) determination scheme, in accordance with various embodiments to be discussed below, can be implemented. Using such an ID determination (e.g., detection) scheme, a memory die can automatically change, for example, its chip select route or memory-mapping depending on how it is arranged in the stack.

Figure 2:
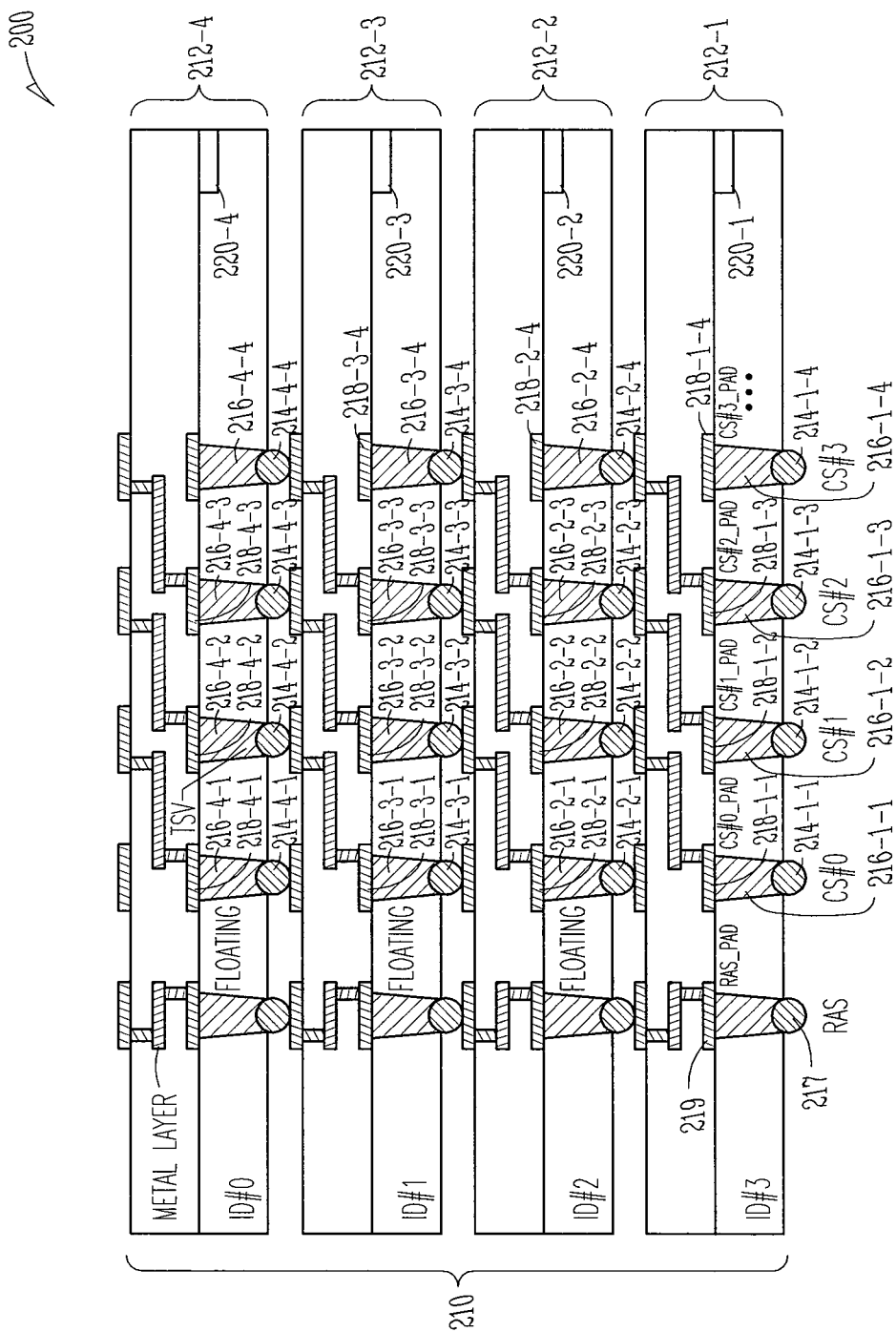
FIG. 2 shows a block diagram of a memory device including a stack of memory dies having a four chip-select specification using float detection circuits, according to various example embodiments.

FIG. 2 shows a block diagram of a memory device 200 including a stack 210 of memory dies 212-1 . . . 212-4 having a four chip-select specification using float detection circuits, according to various example embodiments. In a N chip-select specification for a memory device, N chip-select signals are used in operation of the memory device with an external device such as a processor. Each memory die 212-i (i=1 to 4) can include a float detection circuit, such as one disposed in an identification circuit 220-i (i=1 to 4) on the respective memory die, to determine its own identification. A float detection circuit, as used in various embodiments, is discussed in more detail with respect to FIG. 8.

Each individual memory die 212-i includes a number of TSVs. In stack 210, at least one chip-select connection node on a side of a memory die 212 couples a chip-select TSV of that die to a chip-select TSV of an adjacent memory die 212. As oriented in FIG. 2, for example, chip-select TSV 216-4-4 of memory die 212-4 is coupled to chip-select TSV 216-3-3 of adjacent memory die 212-3 via a chip-select connection node 214-4-4 on one side of memory die 212-4. In FIG. 2, connection nodes 214-i-1, 214-i-2, 214-i-3, 214-i-4 are shown for each memory die 212-i, for i=1, 2, 3, 4. On the opposite side of memory die 212-4, there are no connection nodes. Memory die 212-4 is not coupled to another die (i.e., it is at the "top" of stack 210).

Meanwhile, as oriented in FIG. 2, chip-select connection nodes 214-2-2, 214-2-3 and 214-2-4 on one side of memory die 212-1 couple chip-select TSVs 216-1-1, 216-1-2, and 216-1-3 of memory die 212-1 to chip-select TSVs 216-2-2, 216-2-3 and 216-2-4 of an adjacent memory device 212-2. External chip-select connection nodes 214-1-1 through 214-1-4 on the opposite side of memory die 212-1 can couple chip-select TSVs of memory die 212-1 to one or more external devices. The external coupling may be accomplished using an external structure, such as one of the interface structures previously described with respect to FIG. 1.

Memory die 212-1 is the first die in stack 210 such that the chip-select connection nodes 214-1-1 through 214-1-4 on the side opposite memory die 212-2 are the external chip-select connection nodes of the stack 210. TSVs in each of memory dies 212-i route the appropriate signals to the corresponding memory die 212-i. For example, external connection node 217 can couple a command signal, such as remote address strobe (RAS), from an external processor to memory dies 212-1 . . . 212-4 of memory device 200 via TSVs, connection nodes, and internal (e.g., on-die, such as formed on a substrate of the die) nodes, such as pad 219. To focus on the features of various embodiments discussed herein, many (if not most) of the connections commonly used with a memory device are not shown.

In memory device 200, which has a four chip-select specification, memory device 200 has four external chip-select connection nodes, 214-1-1 . . . 214-1-4. Four chip-select signals can be received by memory device 200, one at each of the external chip-select connection nodes, 214-1-1 . . . 214-1-4. The four chip-select signals are different signals that may each have the same format, such as a binary signal being either a low (L) or a high (H). As arranged in the stack, external chip-select connection nodes, 214-1-1, . . . 214-1-4 couple to corresponding internal chip-select nodes (referred to hereinafter, by example, as "pads") 218-1-1, 218-1-2, 218-1-3, and 218-1-4 via individual chip-select TSVs 216-1-1, 216-1-2, 216-1-3, and 216-1-4, respectively. Pads 218-1-1, 218-1-2, 218-1-3, and 218-1-4 on memory die 212-1 are coupled to identification circuit 220-1, typically on the side of memory die 212-1 that includes active circuits. Identification circuit 220-1 determines its own identification responsive to how it is coupled to one or more external chip-select connection nodes, 214-1-1, . . . 214-1-4, if any.

Each memory die 212-j (j=2, 3, 4) can be structured similar to memory die 212-1. For example, each memory die 212 can include chip-select related TSVs, 216-j-1, 216-j-2, 216-j-3, and 216-j-4 coupled to pads 218-j-1, 218-j-2, 218-j-3, and 218-j-4. Since it to be coupled to a chip-select related node to be a chip-select related TSV, not all TSVs 216 in a stack are chip-select related TSVs. Depending upon the arrangement of the die 212 in the stack 210, one or more of the TSVs 216-j-1, 216-j-2, 216-j-3, and 216-j-4, and a respective one or more of the pads 218-j-1, 218-j-2, 218-j-3, and 218-j-4, may couple the identification circuit 220-j of that die to one or more of external chip-select connection nodes, 214-1-1, 214-1-2, 214-1-3, and 214-1-4. In such a configuration, each memory die 212-j can also determine its own identification. Coupling among memory dies 212-1 . . . 212-4 to allow an identification circuit 220-j to selectively couple to one or more external chip-select connection nodes, 214-1, 214-2, 214-3, and 214-4, can be accomplished by a number of approaches.

For example, the chip-select related TSVs 216 within each of memory dies 212-1 . . . 212-4 can be configured in a similar pattern such that the chip-select related TSVs of the individual memory dies are vertically aligned when memory dies 212-1 . . . 212-4 are arranged in a stack 210. In various embodiments, however, the TSVs 216 of a vertically-aligned pair of adjacent TSVs are not necessarily coupled to one another. Instead, at least one chip-select related TSV of at least one die in the stack 200 can be coupled to a chip-select related TSV of another die in the stack, where the coupled chip-select related TSVs are not vertically aligned (e.g., they are horizontally offset, such as by one TSV placement, from one another). For example, TSV 216-1-1 of die 212-1 can be coupled to TSV 216-2-2 via internal node 218-1-1. Accordingly, in various embodiments, each of the plurality of chip-select related TSVs 216-i-1, 216-i-2, 216-i-3, and 216-i-4 of at least one memory die 212-i (i=1, 2, 3, 4) in stack 210 may or may not be coupled to a chip-select related TSV of an adjacent memory die.

Memory device 200, which includes four memory dies 212-1 . . . 212-4, can use four identifications. Such identifications can be, for example, one of decimal numbers zero through three. In an embodiment, memory die 212-4 at the top of stack 210 (i.e., at an opposite end of stack 210 from external connection nodes 217 and 214-1-1 . . . 214-1-4) is given ID#0, memory die 212-3 is given ID#1, memory die 212-2 is given ID#2, and memory die 212-1 at the bottom of stack 210 (and directly coupled to external connection nodes 217 and 214-1-1 . . . 214-1-4) is given ID#3.

The identification for a memory die 211-i can be determined by its identification circuit 220-i, such as one having a float detection circuit that uses a current sense circuit. The term "float" is used to denote that an input to the float detection circuit may be floating, that is, the input is not coupled to an external chip-select connection node. As shown in FIG. 2, each of the TSVs 216-i-1 in memory dies 212-2, 212-3, and 212-4 that is vertically aligned with external chip-select connection node 214-1-1 (CS#0) is not specifically coupled to that external chip-select connection node 214-1-1 (instead, they are coupled to floating pads 218-i-1 in this embodiment). Each memory die can have a different number and location of floating pads vertically aligned with external chip-select connection nodes 214-1-1 . . . 214-1-4 such that, using current-sense circuits connected to its pads 218-i-1, 218-i-2, 218-i-3, and 218-i-4 (where i=1 to 4 in this embodiment), each memory die 312-i can determine its identification.

Figure 3:
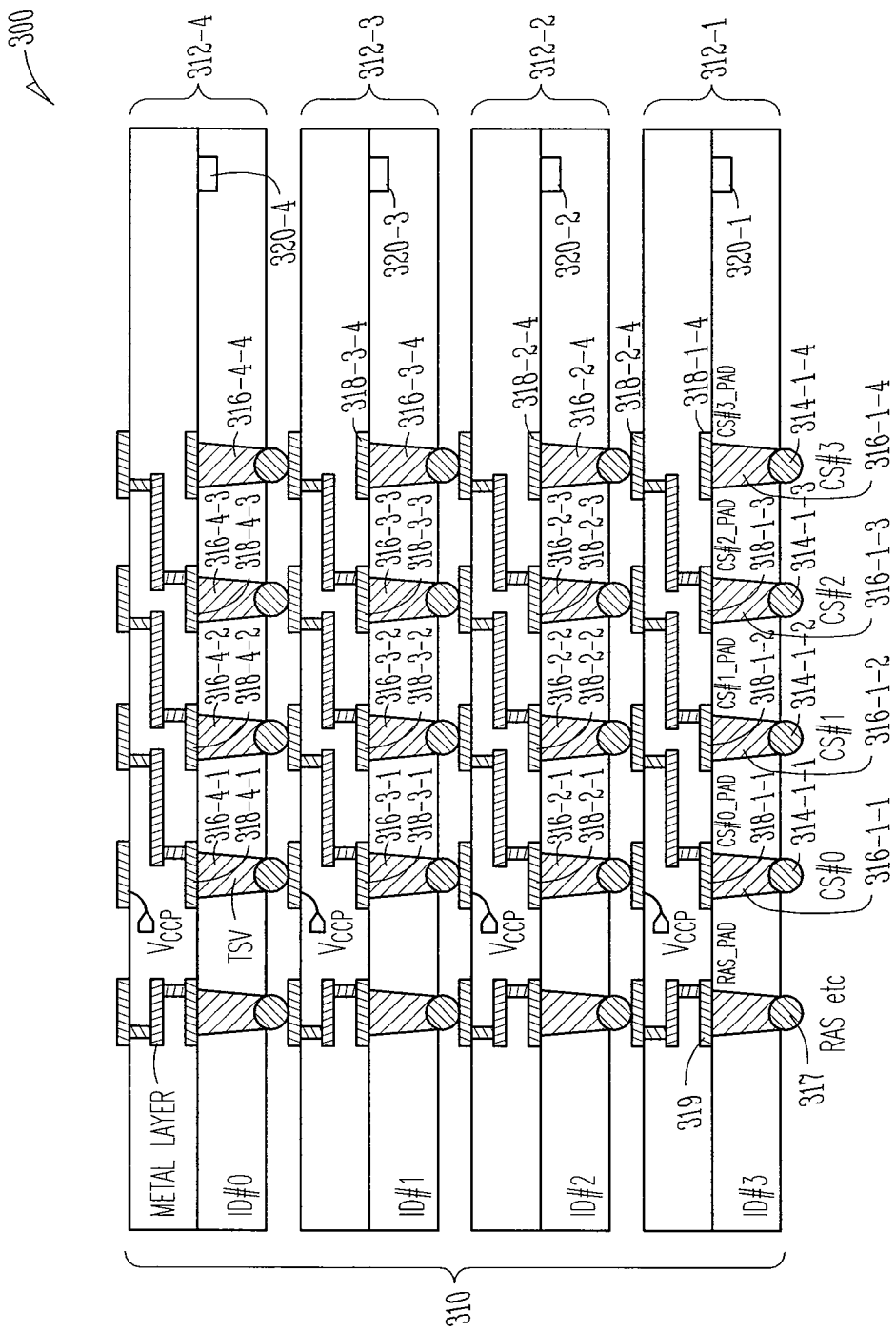
FIG. 3 shows a block diagram of a memory device including a stack of memory dies having a four chip-select specification using voltage detection circuits, according to various example embodiments.

FIG. 3 shows a block diagram of a memory device 300 including a stack 310 of memory dies 312-1 . . . 312-4 having a four chip-select specification using voltage detection circuits, according to various example embodiments. Each memory die 312-i (i=1 to 4) can include a voltage detection circuit, disposed in a respective identification circuit 320-i (i=1 to 4) on the respective memory die, to determine its own identification. A voltage detection circuit, as used in various embodiments, is discussed with respect to FIG. 9.

Each individual memory die 312-i is configured similar to memory die 212-i of FIG. 2, except that each of the chip-select related TSVs 316-i-1 in memory dies 312-2, 312-3, and 312-4 that is vertically aligned with external chip-select connection node 314-1-1 (CS#0) is coupled to an internal reference, such as internal voltage supply $V_{CCP}$, which can be used by the voltage detection circuits in identification circuits 320-2, 320-3, and 320-4 of the memory dies 312-2, 312-3, and 312-4. As oriented in FIG. 3, the external connection nodes 317 and 314-1-1 . . . 314-1-4 are configured to couple memory die 312-1 to one or more external devices. The external coupling may be accomplished using an external structure, such as the interface structures discussed previously with respect to FIG. 1.

Memory die 312-1 is the first die in stack 310 and the external connection nodes 317 and 314-1-1 . . . 314-1-4, on the side opposite memory die 312-2, are provided to externally couple the stack 310 to an external structure. TSVs in each of memory dies 312-i route the appropriate signals to the corresponding memory die 312-i. For example, external connection node 317 can couple a command signal, such as RAS, from an external processor to memory dies 312-1 . . . 312-4 of memory device 300 via TSVs, connection nodes, and internal nodes, such as pad 319. To focus on the features of various embodiments discussed herein, many (if not most) of the connections commonly used with a memory device are not shown.

Memory device 300, which has a four chip-select specification, has four external chip-select connection nodes, 314-1-1 . . . 314-1-4. Four chip-select signals can be received by memory device 300, one at each of the external chip-select connection nodes, 314-1-1 . . . 314-1-4. The four chip-select signals are different signals that may each have the same format, such as a binary signal being either a logic low (L) or a logic high (H). External chip-select connection nodes, 314-1-1, 314-1-2, 314-1-3, and 314-1-4, couple to corresponding chip-select pads 318-1-1, 318-1-2, 318-1-3, and 318-1-4 via individual chip-select TSVs 316-1-1, 316-1-2, 316-1-3, and 316-1-4. Pads 318-1-1, 318-1-2, 318-1-3, and 318-1-4 on memory die 212-1 are coupled to identification circuit 320-1, which can be on the side of memory die 312-1 that includes active circuits. Identification circuit 320-1 determines its own identification responsive to how it is coupled to one or more of external chip-select connection nodes, 314-1-1, 314-1-2, 314-1-3, and 314-1-4, if any.

Each memory die 312-j (j=2, 3, 4) can be structured similar to memory die 312-1. For example, each memory die 312-j can include chip-select related TSVs, 316-j-1, 316-j-2, 316-j-3, and 316-j-4 coupled to respective chip-select related pads 318-j-1, 318-j-2, 318-j-3, and 318-j-4. Depending upon the arrangement of the die 312-j in the stack, one or more of chip-select related TSVs 316-j-1, 316-j-2, 316-j-3, and 316-j-4 and a respective one of chip-select related pads 318-j-1, 318-j-2, 318-j-3, and 318-j-4 may couple the identification circuit 320-j of that die to one or more of external chip-select connection nodes, 314-1-1, 314-1-2, 314-1-3, and 314-1-4. In such a configuration, each memory die 312-j can also determine its own identification. Coupling among memory dies 312-1 . . . 312-4 to allow an identification circuit 320-j to selectively couple to one or more of external chip-select connection nodes, 314-1-1, 314-1-2, 314-1-3, and 314-1-4 can be accomplished by a number of approaches.

For example, the chip-select related TSVs 316 within each of memory dies 312-1 . . . 312-4 can be configured in a similar pattern such that the chip-select related TSVs of the individual memory dies are aligned when memory dies 312-1 . . . 312-4 are arranged in a stack 310. In various embodiments, however, the TSVs 316 of a vertically-aligned pair of adjacent chip-select related TSVs are not necessarily coupled to one another. Instead, at least one chip-select related TSV of at least one die in the stack 300 can be coupled to a chip-select related TSV of another die in the stack, where the coupled chip-select related TSVs are not vertically aligned (e.g., they are horizontally offset, such as by one TSV placement, from one another). For example, TSV 316-1-1 of die 312-1 can be coupled to TSV 316-2-2 via internal node 318-1-1. Accordingly, in various embodiments, each of the plurality of chip-select related TSVs 316-i-1, 316-i-2, 316-i-

3, and 316-i-4 of at least one memory die 312-i (i=1, 2, 3, 4) in stack 310 may or may not be coupled to a chip-select related TSV of an adjacent memory die.

Memory device 300, which includes four memory dies 312-1 ... 312-4, can use four identifications. Such identifications can be, for example, one of decimal numbers zero through three. In an embodiment, memory die 312-4 at the top of stack 310 (i.e., at an opposite end of stack 310 from external connection nodes 317 and 314-1) is given ID#0, memory die 312-3 is given ID#1, memory die 312-2 is given ID#2, and memory die 312-1 at the bottom of stack 310 (and directly coupled to external connection nodes 317 and 314-1) is given ID#3. The identification for a memory die 311-i can be determined by its identification circuit 320-i, which can include a voltage detection circuit, for example.

Figure 4:
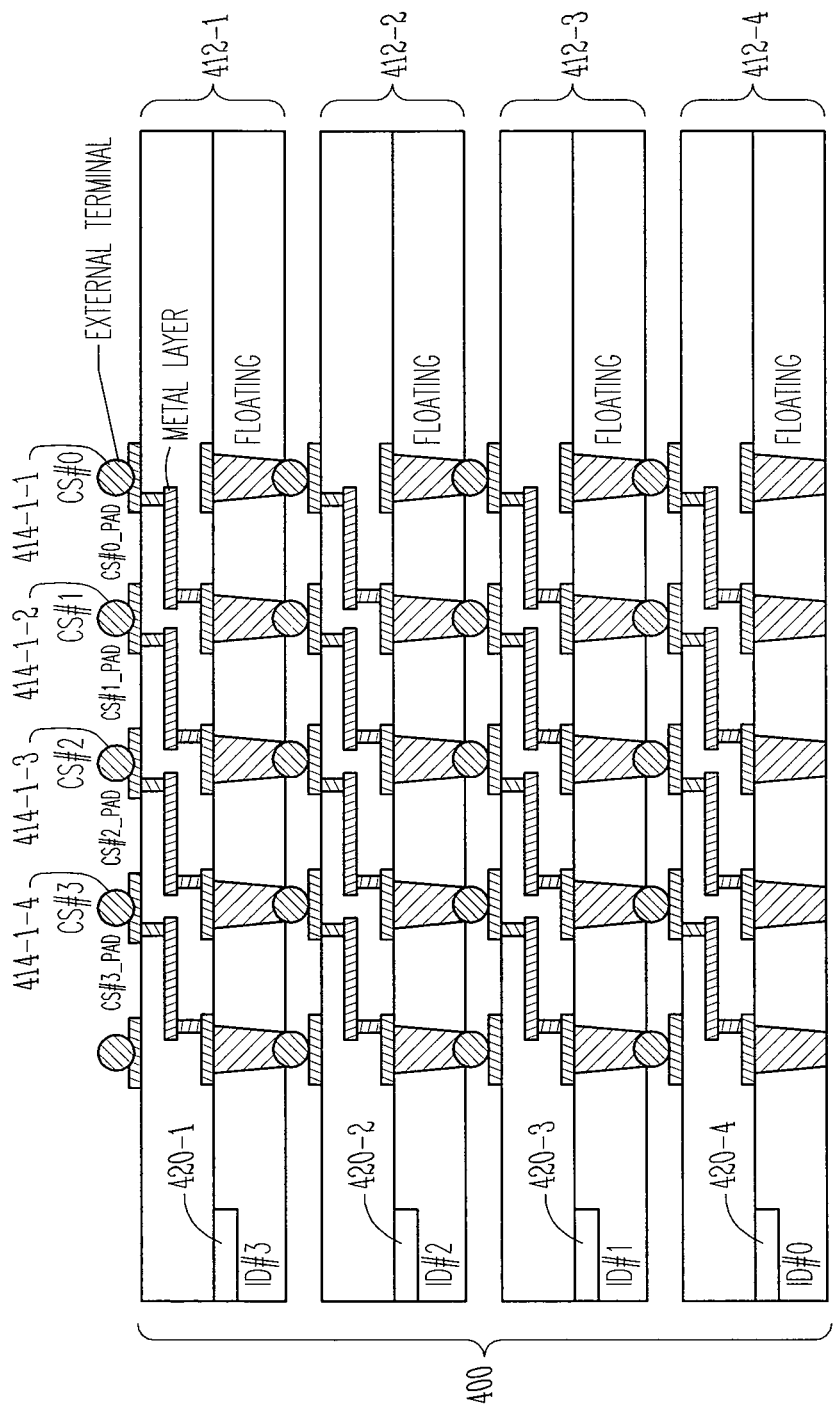
FIG. 4 shows a block diagram of a memory device including a stack of memory dies having a four chip-select specification with overlying external connections using float detection circuits, according to various example embodiments.

FIG. 4 shows a block diagram of a memory device 400 including a stack 410 of memory dies 412-1 ... 412-4 having a four chip-select specification with overlying external connection nodes, and wherein the memory dies each include a respective float detection circuit, according to various example embodiments. Memory device 400 is similar to memory device 200 of FIG. 2 except that memory stack 410 is oriented for an inverted external coupling with respect to the orientation of memory stack 210 of memory device 200. Memory device 400 can connect to an external structure, such as one of the interface structures discussed previously with respect to FIG. 1, with the external structure disposed on top of memory device 400. External chip-select connection nodes, 414-1-1, 414-1-2, 414-1-3, and 414-1-4 of memory die 412-1 can provide at least some external connections for memory device 400. As with memory device 200, the chip-select related TSVs 416-i-1 in memory dies 412-2 ... 412-4 that are vertically aligned with external chip-select connection node 414-1-1 (CS#0) are floating, and each of identification circuits 420-1 ... 420-4 can include a float detection circuit.

Figure 5:
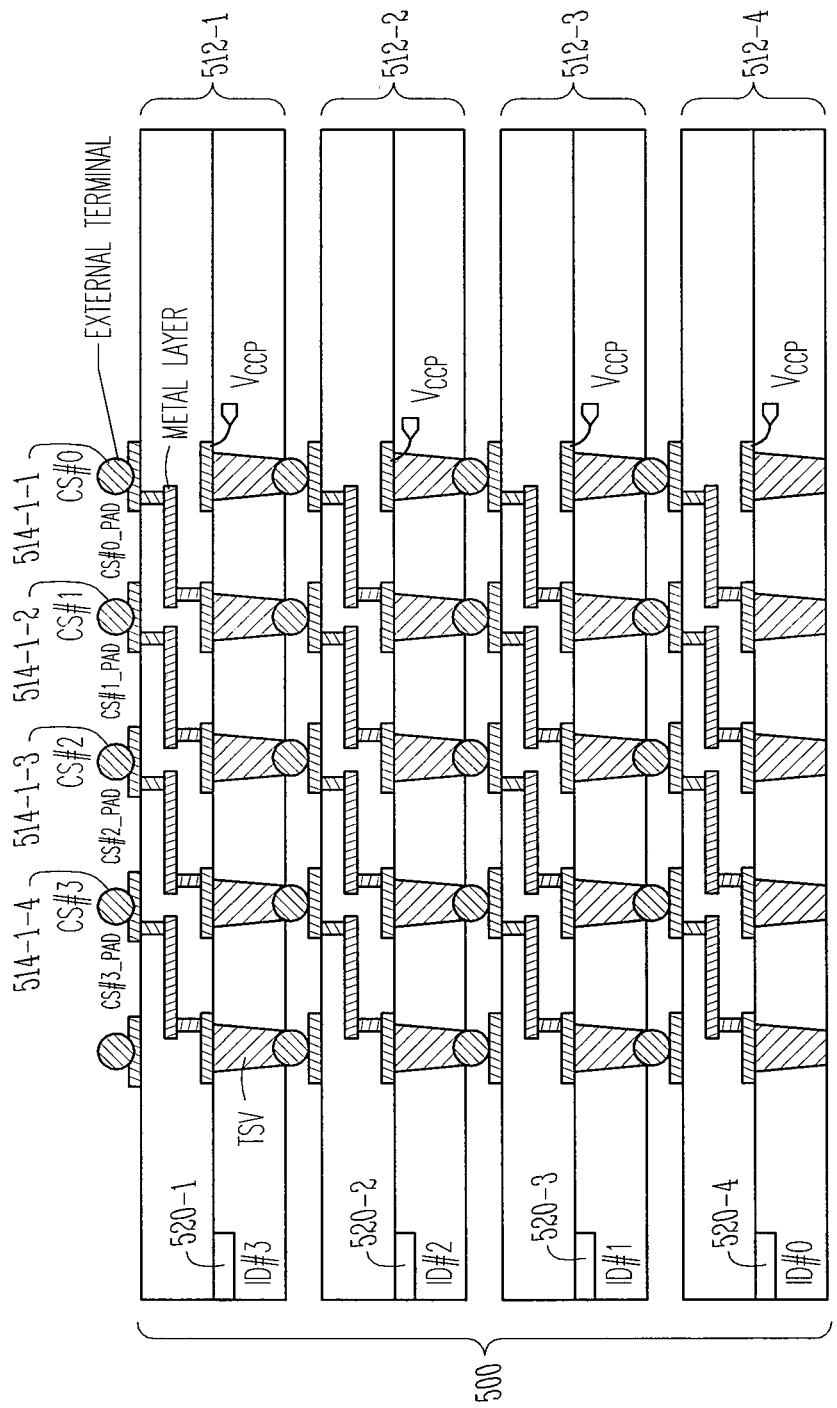
FIG. 5 shows a block diagram of a memory device including a stack of memory dies having a four chip-select specification with overlying external connections using voltage detection circuits, according to various example embodiments.

FIG. 5 shows a block diagram of a memory device 500 including a stack of memory dies 512-1 ... 512-4 having a four chip-select specification with overlying external connection nodes, and wherein the memory dies each include a respective voltage detection circuit, according to various example embodiments. Memory device 500 is similar to memory device 300 of FIG. 3 except that memory stack 510 is oriented for an inverted external coupling with respect to the orientation of memory stack 310 of memory device 300. Memory device 500 can connect to an external structure, such as one of the interface structures discussed previously with respect to FIG. 1, with the external structure disposed on top of memory device 500. External chip-select connection nodes, 514-1-1, 514-1-2, 514-1-3, and 514-1-4 of memory die 512-1 can provide at least some external connections for memory device 500. As with memory device 300, the chip-select related TSVs 516-i-1 in memory dies 512-2 ... 512-4 that are vertically aligned with external chip-select connection node 514-1-1 (CS#0) are each coupled to an internal reference, such as an internal voltage supply $V_{CCP}$, and each of identification circuits 520-1 ... 520-4 can include a voltage detection circuit.

Figure 6:
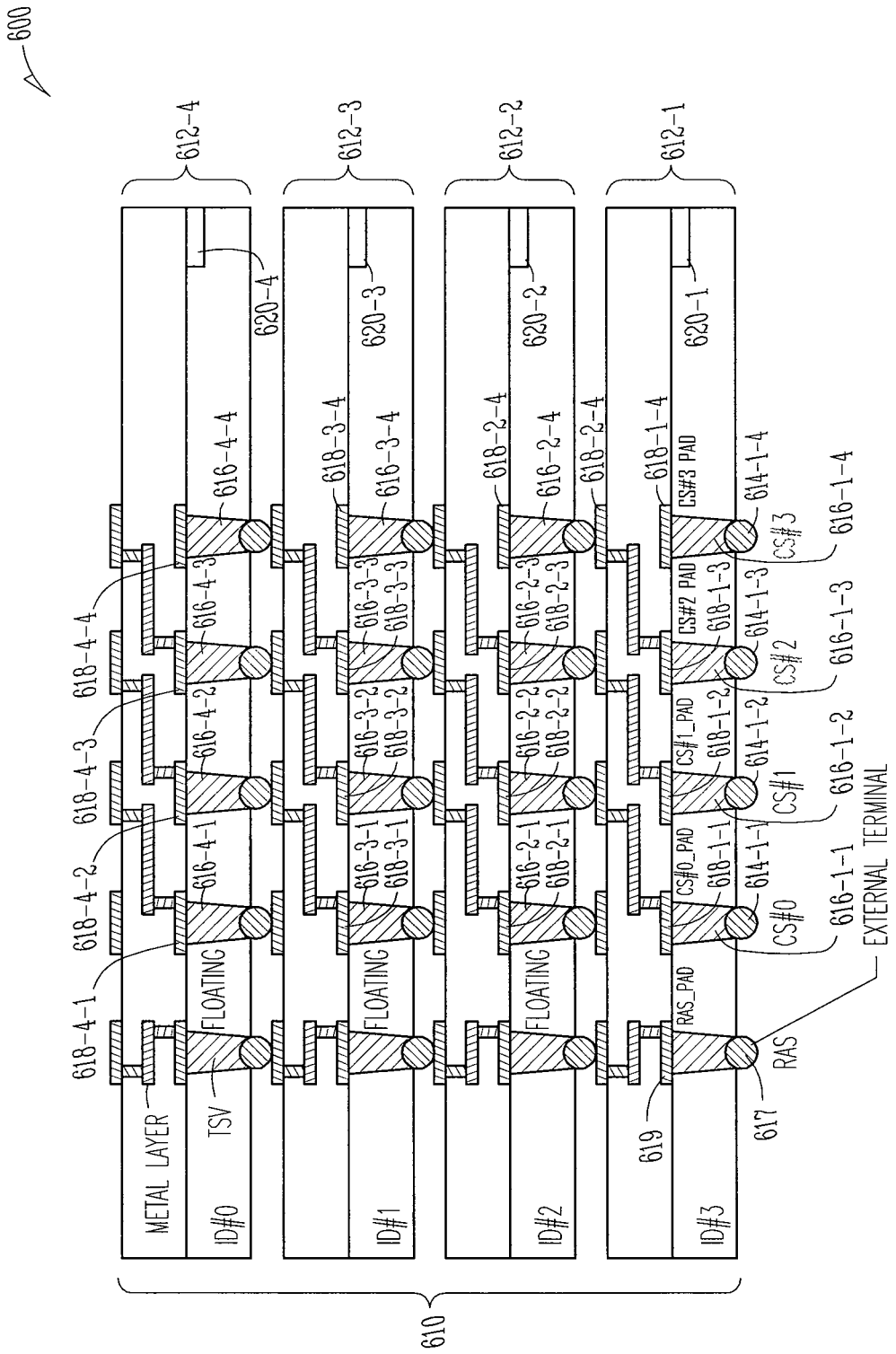
FIG. 6 shows a block diagram of a memory device including a stack of memory dies having a two chip-select specification, according to various example embodiments.

FIG. 6 shows a block diagram of a memory device 600 including a stack 610 of memory dies 612-1 ... 612-4 having a two chip-select specification, according to various example embodiments. Each memory die 612-i (i=1 to 4) can include a float detection circuit, for example, disposed in a respective identification circuit 620-i (i=1 to 4) on the respective memory die, to determine its own identification.

Each individual memory die 612-i includes a number of TSVs. In stack 610, at least one chip-select connection node on a side of at least one memory die 612 couples a chip-select TSV of that die to a chip-select TSV of an adjacent memory die 612. For example, as oriented in FIG. 6, chip-select TSV 616-4-4 of memory die 612-4 is coupled to chip-select TSV 616-3-3 of adjacent memory device 612-3 on one side of memory die 612-4. On the opposite side of memory die 612-4, there are no external connection nodes. Memory die 612-4 is not coupled to another die (i.e., it is at the "top" of stack 610).

Meanwhile, as oriented in FIG. 6, chip-select connection nodes 614-2-2 and 614-2-3 on one side of memory die 612-1 couple chip-select TSVs 616-1-1 and 616-1-2 of memory die 612-1 to chip-select TSVs 616-2-2 and 616-2-3 of adjacent memory die 612-2. External chip-select connection nodes 614-1-1 and 614-1-2 on the opposite side of memory die 621-1 can couple chip-select TSVs 616-1-1 and 616-1-2, respectively, of memory die 612-1 to one or more external devices. The external coupling may be accomplished using an external structure, such as one of the interface structures discussed previously with respect to FIG. 1.

Memory die 612-1 is the first die in stack 610 and the external connection nodes 617, 614-1-1 and 614-1-2, on the side opposite memory die 612-2, are provided to externally couple the stack 610 to an external structure. TSVs in each of memory dies 612-i route the appropriate signals to the corresponding memory die 612-i. For example, external connection node 617 can couple a command signal, such as RAS, from an external processor to memory dies 612-1 ... 612-4 of memory device 600 via TSVs, connection nodes, and internal nodes, such as pad 619. To focus on the features of various embodiments discussed herein, many (if not most) of the connections commonly used with a memory device are not shown.

Memory device 600, which has a two chip-select specification, has two external chip-select connection nodes, 614-1-1 and 614-1-2, to provide external connection nodes for stack 610 with respect to a chip select function of memory device 600. Two chip-select signals can be received by memory device 600, one at each of the external chip-select connection nodes, 614-1-1 and 614-1-2. The two chip-select signals are different signals that may each have the same format, such as a binary signal being either a logic low (L) or a logic high (H).

External chip-select connection nodes, 614-1-1 and 614-1-2 couple to corresponding pads 618-1-1 and 618-1-2 via individual TSVs 616-1-1 and 616-1-2. Pads 618-1-1, 618-1-2, 618-1-3, and 618-1-4 on memory die 612-1 are coupled to an identification circuit 620-1, which can be on the side of memory die 612-1 that includes active circuits. Identification circuit 620-1 determines its own identification responsive to how it is coupled to one or more of external chip-select connection nodes, 614-1-1 and 614-1-2, if any.

Each memory die 612-j (j=2, 3, 4) can be structured similar to memory die 612-1. For example, each memory die 612-j can include chip-select related TSVs, 616-j-1, 616-j-2, 616-j-3, and 616-j-4 coupled to respective pads 618-j-1, 618-j-2, 618-j-3, and 618-j-4. Depending upon the arrangement of the die 612-j in the stack, one or more of chip-select related TSVs, 616-j-1, 616-j-2, 616-j-3, and 616-j-4 and a respective one or more of pads 618-j-1, 618-j-2, 618-j-3, and 618-j-4) may couple the identification circuit 620-j of that die to one or more of external chip-select connection nodes, 614-1-1 and 614-1-2. In such a configuration, each memory die 612-j can also determine its own identification. Coupling among memory dies 612-1 ... 612-4 to allow an identification circuit 620-j to selectively couple to one or more of external chip-select connection nodes, 614-1-1 and 614-1-2, can be accomplished by a number of approaches.

For example, the chip-select related TSVs 616 within each of memory dies 612-1 ... 612-4 can be configured in a similar pattern such that the TSVs of the individual memory dies are vertically aligned when memory dies 612-1 ... 612-4 are arranged in a stack 610. In various embodiments, however, the chip-select related TSVs 616 of a vertically-aligned pair of adjacent TSVs are not necessarily coupled to one another. Instead, at least one chip-select related TSV of at least one die in the stack 600 can be coupled to a chip-select related TSV of another die in the stack, where the coupled chip-select related TSVs are not vertically aligned (e.g., they are horizontally offset, such as by one TSV placement, from one another). For example, TSV 616-1-1 of die 612-1 can be coupled to TSV 616-2-2 via internal node 618-1-1. Accordingly, in various embodiments, each of the plurality of chip-select related TSVs 616-i-1, 616-i-2, 616-i-3, and 616-i-4 of at least one memory die 612-i (i=1, 2, 3, 4) in stack 610 may or may not be coupled to a chip-select related TSV of an adjacent memory die.

Memory device 600, which includes four memory dies 612-1 ... 612-4, can use four identifications. Such identifications can be, for example, one of decimal numbers zero through three. In an embodiment, memory die 612-4 at the top of stack 610 (i.e., at an opposite end of stack 610 from external connection nodes 617 and 614-1) is given ID#0, memory die 612-3 is given ID#1, memory die 612-2 is given ID#2, and memory die 612-1 at the bottom of stack 610 (and directly coupled to external connection nodes 617 and 614-1) is given ID#3. The identification for a memory die 611-i can be determined by its identification circuit 620-i, such as one having a float detection circuit (e.g., one that uses a current sense circuit). As shown in FIG. 6, each of the TSVs 616-i-1 in memory dies 612-2, 612-3, and 612-4 that is vertically aligned with external chip-select connection node 614-1-1 (CS#0) is not specifically coupled to that external connection node 614-1-1 (instead, they are coupled to floating pads 618-i-1 in this embodiment).

Figure 7:
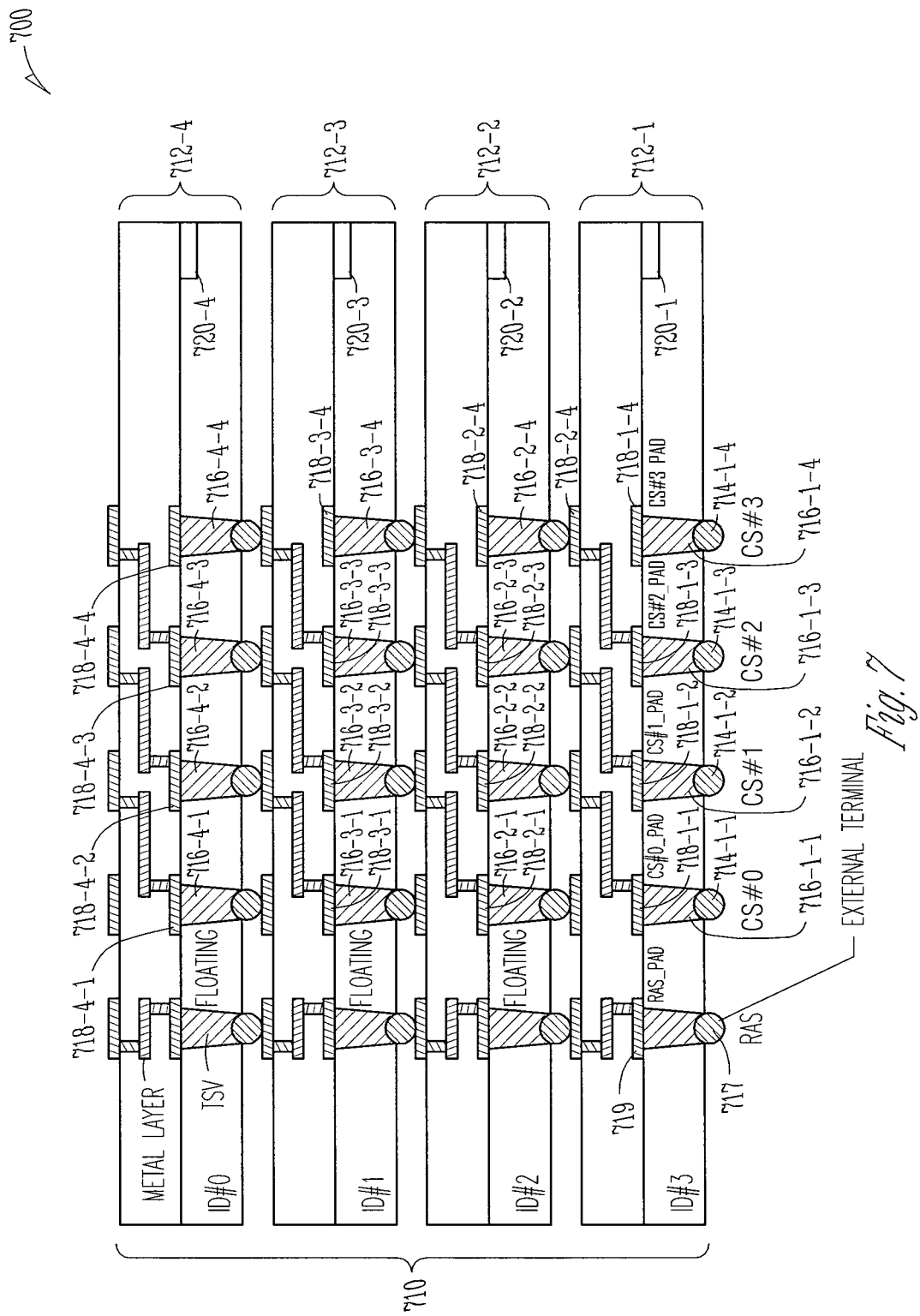
FIG. 7 shows a block diagram of a memory device including a stack of memory dies having a one chip-select specification, according to various example embodiments.

FIG. 7 shows a block diagram of a memory device 700 including a stack 710 of memory dies 712-1 ... 712-4 having a one chip-select specification, according to various example embodiments. Each memory die 712-i (i=1 to 4) can include a float detection circuit, for example, disposed in an identification circuit 720-i (i=1 to 4) on the respective memory die, to determine its own identification.

Each individual memory die 712-i includes a number of TSVs. In stack 710, one chip-select connection node on a side of at least one memory die 712 couples one chip-select TSV of that die to a chip-select TSV of an adjacent memory die 712. As oriented in FIG. 7, for example, chip-select TSV 716-4-4 of memory die 712-4 is coupled to chip select TSV 716-3-3 of adjacent memory die 712-3 on one side of memory die 712-4. On the opposite side of memory die 712-4, there are no external connection nodes. Memory die 712-4 is not coupled to another die (i.e., it is at the "top" of stack 710).

Meanwhile, as oriented in FIG. 7, a chip-select connection node 714-2-2 on one side of memory die 712-1 couples chip select TSV 716-1-1 of memory die 712-1 to chip-select TSV 716-2-2 of adjacent memory device 712-2. External chip-select connection node 714-1-1 on the opposite side of memory die 712-1 can couple chip select TSV 716-1-1 of memory die 712-1 to one or more external devices. The external coupling may be accomplished using an external structure, such as one of the interface structures previously described with respect to FIG. 1.

Memory die 712-1 is the first die in stack 710 and the external connection nodes 717 and 714-1-1, on the side opposite memory die 712-2, are provided to externally couple the stack 710 to an external structure. TSVs in each of memory dies 712-i route the appropriate signals to the corresponding memory die 712-i. For example, external connection node 717 can couple a command signal, such as RAS, from an external processor to memory dies 712-1 ... 712-4 of memory device 700 via TSVs, connection nodes, and internal nodes, such as pad 719. To focus on the features of various embodiments discussed herein, many (if not most) of the connections commonly used with a memory device are not shown.

Memory device 700, which has a one chip-select specification, has a single external chip-select connect node 714-1-1 to provide an external connection node for stack 710 with respect to a chip select function of memory device 700. A chip-select signal can be received by memory device 700 at chip-select connection node 714-1-1, and may be a binary signal. TSVs 716-1-2, 716-1-3 and 716-1-4 are not connected to and do not receive chip-select signals from an external structure for memory operation.

Chip-select related pads 718-1-1, 718-1-2, 718-1-3, and 718-1-4 are coupled to corresponding TSVs 716-1-1, 716-1-2, 716-1-3, and 716-1-4. Of those pads and TSVs, external chip-select connection node 714-1-1 is coupled to pad 718-1-1 via TSV 716-1-1. Pads 718-1-1, 718-1-2, 718-1-3, and 718-1-4 on memory die 712-1 are coupled to an identification circuit 720-1, which can be on the side of memory die 712-1 that includes active circuits. Identification circuit 720-1 determines its own identification responsive to how it is coupled to external chip-select connection node 714-1-1, if at all.

Each memory die 712-j (j=2, 3, 4) can be structured similar to memory die 712-1. For example, each memory die 712-j has TSVs, 716-j-1, 716-j-2, 716-j-3, and 716-j-4 coupled to respective pads 718-j-1, 718-j-2, 718-j-3, and 718-j-4. Depending upon the arrangement of the die in the stack, one of TSVs 716-j-1, 716-j-2, 716-j-3, and 716-j-4, and a respective one of pads 718-j-1, 718-j-2, 718-j-3, and 718-j-4 may couple the identification circuit 720-j of that die to chip-select connection node 714-1-1. In such a configuration, each memory die 712-j can also determine its own identification. Coupling among memory dies 712-1 ... 712-4 to allow an identification circuit 720-j to selectively couple to a chip-select connection node 714-1-1 can be accomplished by a number of approaches.

For example, the chip-select related TSVs 716 within each of memory dies 712-1 ... 712-4 can be configured in a similar pattern such that the TSVs of the individual memory dies are vertically aligned when memory dies 712-1 ... 712-4 are arranged in a stack 710. In various embodiments, however, the chip-select related TSVs 716 of a vertically-aligned pair of adjacent chip-select related TSVs are not necessarily coupled to one another. Instead, one chip-select related TSV of at least one die in the stack 700 can be coupled to a chip-select related TSV of another die in the stack, where the coupled chip-select related TSVs are not vertically aligned (e.g., they are horizontally offset, such as by one TSV placement, from one another). For example, TSV 716-1-1 of die 712-1 can be coupled to TSV 716-2-2 via internal node 718-1-1. Accordingly, in various embodiments, each of the plurality of chip-select related TSVs 716-i-1, 716-i-2, 716-i-3, and 716-i-4 of at least one memory die 712-i (i=1, 2, 3, 4) in stack 710 may or may not be coupled to a chip-select related TSV of an adjacent memory die.

Memory device 700, which includes four memory dies 712-1 ... 712-4, can use four identifications. Such identifications can be, for example, one of decimal numbers zero through three. In an embodiment, memory die 712-4 at the top of stack 710 (i.e., at an opposite end of stack 710 from external connection nodes 717 and 714-1-1) is given ID#0, memory die 712-3 is given ID#1, memory die 712-2 is given ID#2, and memory die 712-1 at the bottom of stack 710 (and directly coupled to external connection nodes 717 and 714-1-1) is given ID#3. The identification for a memory die 711-i can be determined by its identification circuit 720-i, such as one having a float detection circuit (e.g., one that uses a current sense circuit).

As shown in FIG. 7, each of the TSVs 716-i-1 in memory dies 712-2, 712-3, and 712-4 that is vertically aligned with external connection node 714-1-1 (CS#0) is not specifically coupled to that external connection node 714-1-1 (instead, they are coupled to floating pads 718-i-1 in this embodiment). As with stacked memory devices discussed with respect to FIGS. 2-6, the memory die 712 of memory device 700 have a common design and the memory device 700 uses shifted connections between chip-select related TSVs and an identification circuit on each memory die. With, for example, the float detection circuits of memory device 700 coupled to their respective chip-select related internal nodes, each memory die 712-i can determine its identification (e.g., its position within the stack).

Figure 8:
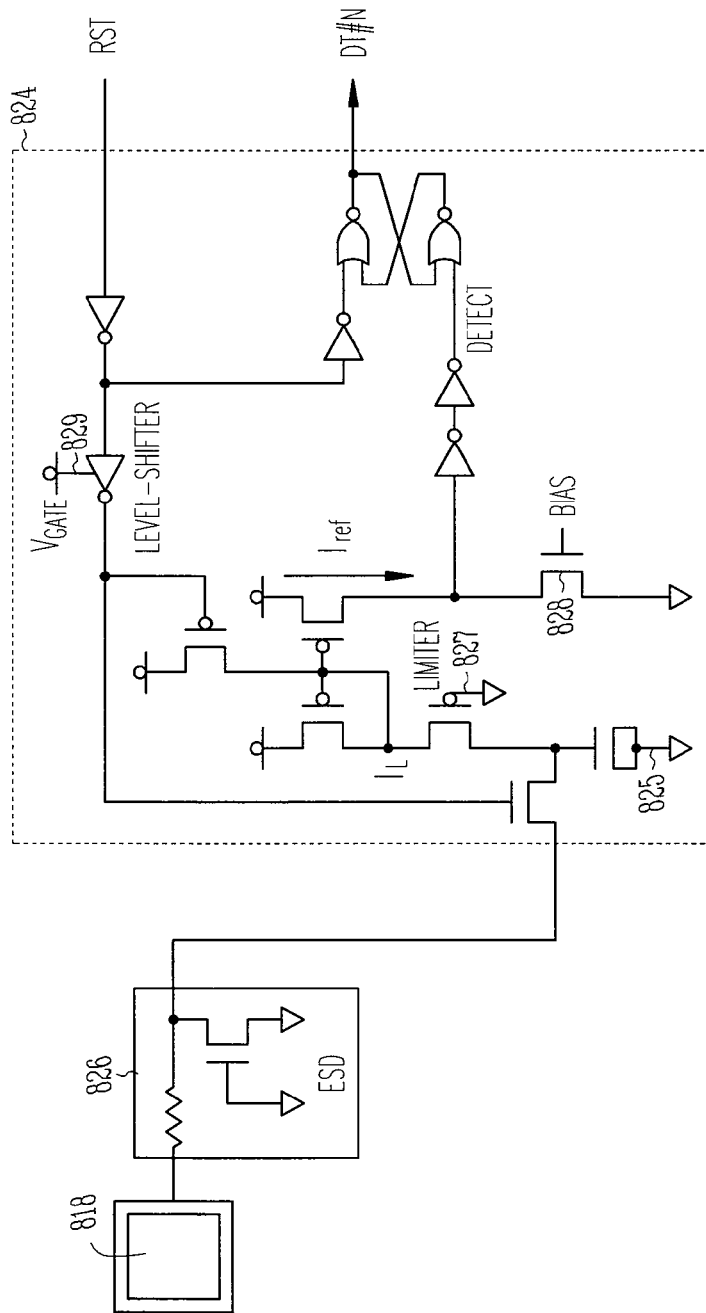
FIG. 8 shows a block diagram of a float detection circuit, according to various example embodiments.

As previously discussed, memory devices such as memory devices 200, 400, 600, and 700 of FIGS. 2, 4, 6, and 7, respectively, can include one or more float detection circuits 824 on each memory die of the memory devices (e.g., each memory die might include one float detection circuit for each chip-select related TSV of the die). FIG. 8 shows a block diagram of one such float detection circuit 824 on a memory die, according to various example embodiments. Float detection circuit 824 includes a current sense circuit 825 that couples to an internal node, such as a pad 818 on the memory die. Pad 818 might correspond to one of the previously discussed pads 218, 418, 618 or 718, for example. Float detection circuit 824 can be coupled with pad 818 via an electrostatic discharge circuit (ESD) 826. Float detection circuit 824 can also be configured to receive a reset signal, RST. The reset signal can be directed to float detection circuit 824 as a pulse input generated during a power-on cycle.

With respect to current sense circuit 825, sense current $I_L$ is configured to flow to a coupled connection node (if any) via pad 818. $I_{ref}$ is a reference current mirroring sense current $I_L$. When pad 818 is floating (e.g., the coupled connection node is floating or no connection node is coupled to the pad), sense current $I_L$ will become nearly zero. Since reference current $I_{ref}$ is dominated with its sink current biased by n-MOS transistor 828, its output signal "detect" is set to a logic low level.

When pad 818 is connected to a connection node that is not floating, sense current $I_L$ will become a certain value limited by limiter 827, which can be formed by a p-MOS transistor. Since reference current $I_{ref}$ is larger than its sink current biased by n-MOS transistor 828, its output signal "detect" is set to a logic high level. Therefore, a detection output signal DT#N is provided from float detection circuit 824, where the state of the detection output signal depends on whether the connection node coupled to pad 818 is floating or not (where N corresponds to the respective connection node of the die coupled to pad 818).

Float detection circuit 824 includes a source node 829 to provide a relative high voltage, $V_{GATE}$. The voltage level for $V_{GATE}$ can be set higher than supply voltage, $V_{CC}$. For example, a $V_{GATE}$ level can be set as $V_{CC}+V_t$, where $V_t$ is a threshold voltage of an input n-MOS transistor. $V_{GATE}$ can be set at other levels. A level-shifter can be used with $V_{GATE}$ set higher than $V_{CC}$.

Figure 9:
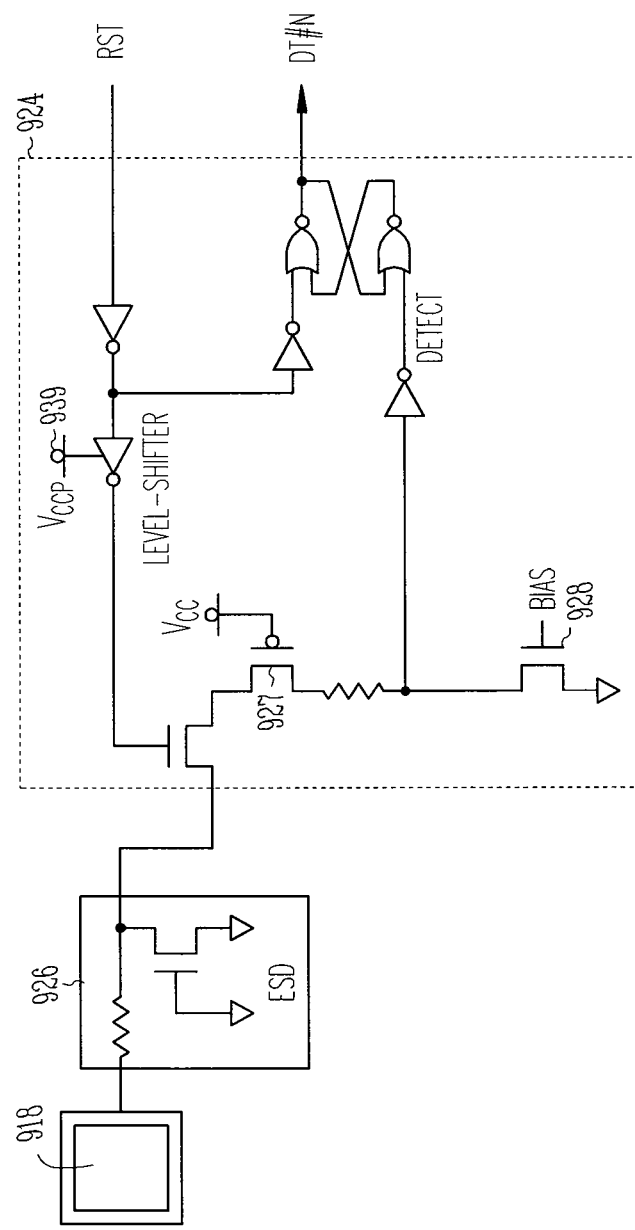
FIG. 9 shows a block diagram of a voltage detection circuit, according to various example embodiments.

As previously discussed, memory devices such as memory devices 300 and 500 of FIGS. 3 and 5, respectively, can alternatively or additionally include one or more voltage detection circuits 824 on each memory die of the memory devices (e.g., each memory die might include one voltage detection circuit for each chip-select related TSV of the die). FIG. 9 shows a block diagram of one such voltage detection circuit 924 on a memory die, according to various example embodiments. Voltage detection circuit 924 couples to an internal node, such as pad 918 on the memory die. Pad 918 might correspond to one of previously the discussed pads 318 or 518, for example. Voltage detection circuit 924 can be coupled with pad 918 via an electrostatic discharge circuit (ESD) 926. Voltage detection circuit 924 can also be configured to receive a reset signal, RST. The reset signal can be directed to voltage detection circuit 924 as a pulse input generated during a power-on cycle.

With pad 918 operatively coupled to transistor 927, the state of the signal at pad 918 controls the output of transistor 928, whose gate is coupled to a bias. The output from transistor is used to provide the "detect" signal. Therefore, a detection output signal DT#N is provided from voltage detection circuit 924, where the state of the detection output signal depends on the state of the signal at pad 918 (where N corresponds to the respective connection node of the die coupled to pad 918).

Voltage detection circuit 924 includes a source node 939 to provide a relative high voltage, $V_{CCP}$. The voltage level for $V_{CCP}$ is set higher than supply voltage, $V_{CC}$. The $V_{CCP}$ level can be set as $V_{CC}+V_t$, where $V_t$ is a threshold voltage of an n-MOS transistor. A level-shifter can be used with $V_{CCP}$ set higher than $V_{CC}$.

Figure 10:
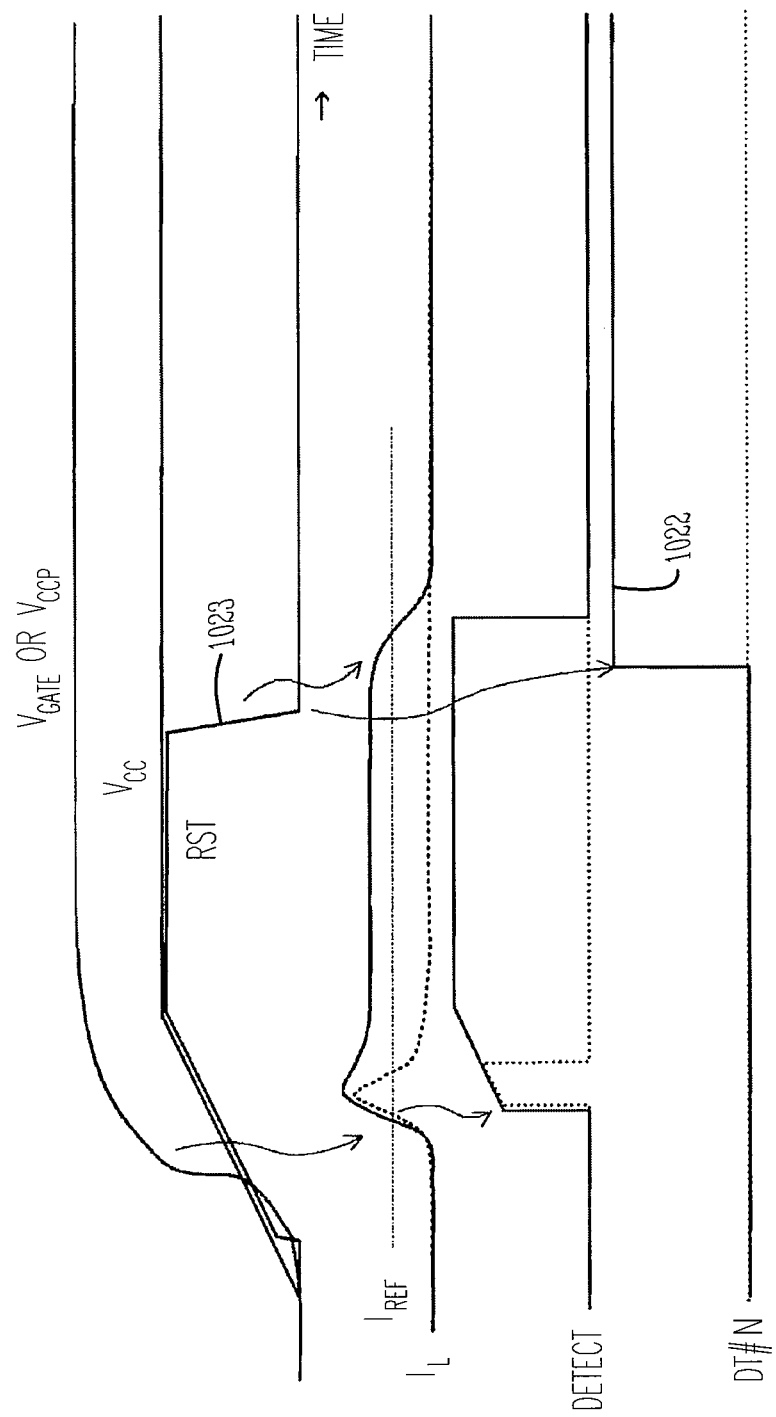
FIG. 10 shows waveforms for identification detection on a memory die, according to various example embodiments.

FIG. 10 shows waveforms for identification detection on a memory die, according to various example embodiments. The waveforms indicate a change in a detection signal, DT#N, 1022 from either a float detection circuit as shown in FIG. 8 or a voltage detection circuit as shown in FIG. 9. The change in DT#N 1022 follows a trailing edge 1023 of the reset signal, RST, directed to the detection circuits of FIGS. 8 and 9.

Figure 11:
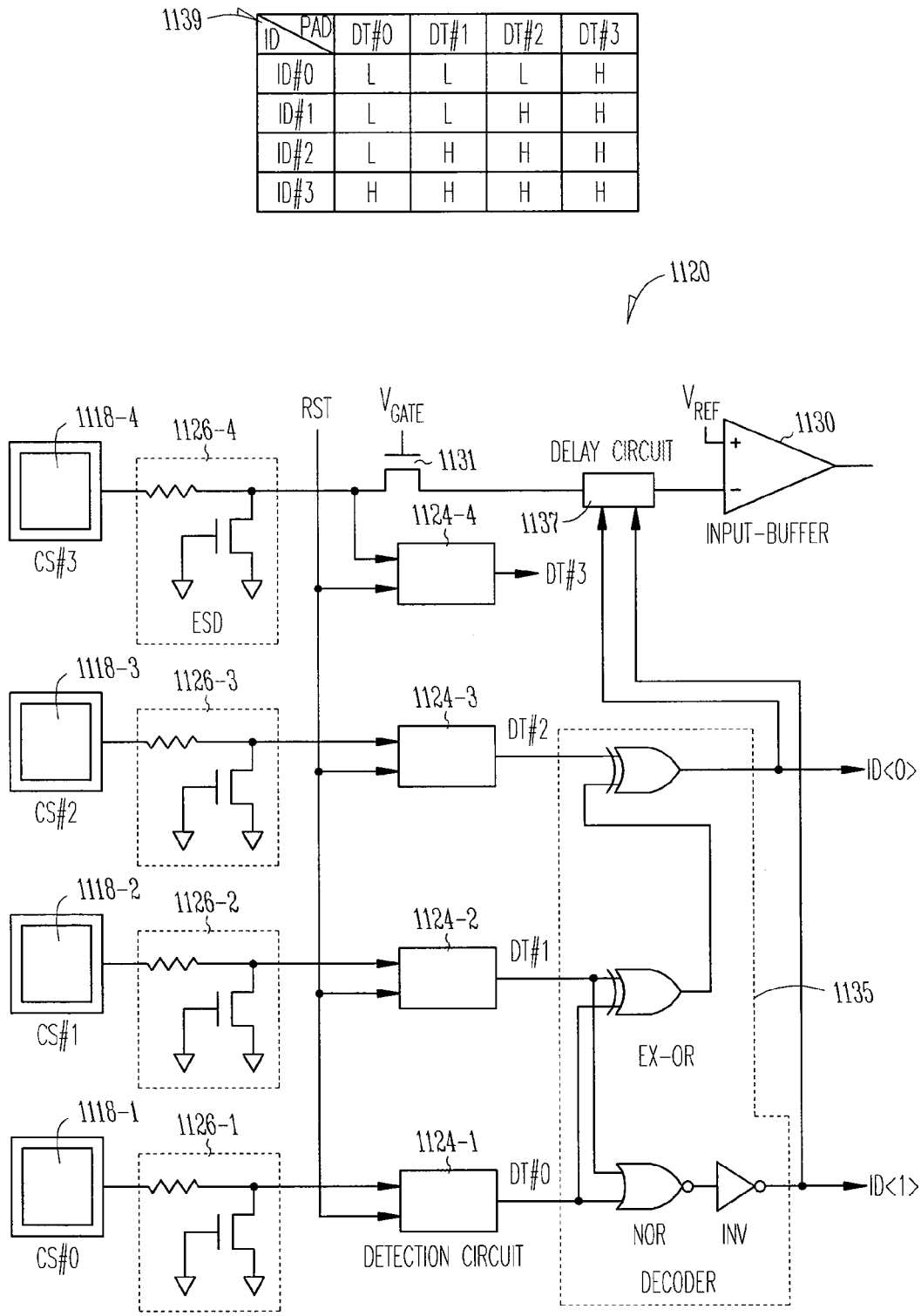
FIG. 11 shows a block diagram of an identification circuit for a memory die used in a stack of memory dies having a four chip-select specification, according to various example embodiments.

FIG. 11 shows a block diagram of an identification circuit 1120 for a memory die to be used in a stack of memory dies having a four chip-select specification, according to various example embodiments. Identification circuit 1120 includes four detection circuits 1124 and a decoder 1135. Although four detection circuits 1124 are shown in FIG. 11, the number of detection circuits could vary; for example, the number of detection circuits could depend on the structure of the decoder 1135, the number of memory dies disposed in the stack of memory dies, and/or the chip-select specification. For the non-limiting example embodiment shown in FIG. 11, identification circuit 1120 couples to four pads 1118-1 . . . 1118-4 (via ESD circuits 1126-1 . . . 1126-4, respectively).

An identification circuit such as identification circuit 1120 can be configured on each of the memory dies of the stack, and pads 1118-1 . . . 1118-4 on each memory die can couple to chip-select related connection nodes of the stacked memory device. One or more of the chip-select related connection nodes are configured to be selectively coupled to a chip-select depending upon the arrangement of the respective die in the stack. Identification circuit 1120 can be used on each of the memory dies shown in FIGS. 2-5, for example.

The detection circuits 1124 can each be a float detection circuit, such as those described with respect to memory devices 200 and 400 of FIGS. 2 and 4, respectively, or a voltage detection circuit, such as those described with respect to memory devices 300 and 500 of FIGS. 3 and 5, respectively. As shown in FIG. 11, identification circuit 1120 includes detection circuits 1124-1 ... 1123-4. With each of these detections circuits being identical (although they each receive an input from a different one of pads 1118-1 ... 1118-4 of the die), the fabrication can be simplified based on the uniformity of forming these circuits. As one of ordinary skill in the art can appreciate, however, in an alternative embodiment, identification circuit 1120 may not include detection circuit 1124-4, as DT#3 is not needed to identify the memory die in the scheme discussed below.

Detection signals DT#0, DT#1, and DT#2 output from detection circuits 1124-1 ... 1123-3, respectively, are input to decoder 1135, which detects an identification of its respective memory die responsive to the states of the detection signals. The identification is output as signals ID<0> and ID<1>. With four or less memory dies in a stacked memory device, decoder 1135 can provide two binary ID signals, where each memory die is identified as either 0 (binary 00), 1 (binary 01), 2 (binary 10), or 3 (binary 11).

Input chart 1139 shows an example of identification determination responsive to how a die including identification circuit 1120 is arranged in a stack. For example, assuming the memory die corresponding to identification circuit 1120 is memory die 212-1 in stack 210 (wherein the detection circuits 1124 are float detection circuits), during identification, float detection circuit 1124-1 would output a detect signal DT#0 having a high state. This is because pad 1118-1 (which corresponds to pad 218-1-1 in this example) is coupled to external chip-select connection node 214-1-1, and therefore is not floating in this embodiment.

Pads 1118-2, 1118-3, and 1118-4 in this example would correspond to pads 218-1-2, 218-1-3, and 218-1-4, respectively, and those pads are also coupled to external chip-select connection nodes 214-1-2, 214-1-3, and 214-1-4, respectively. Accordingly, none of pads 1118-2, 1118-3, and 1118-4 are floating either. Therefore, the detect signals, DT#1, DT#2, and DT#3 output by float detection circuits 1124-2, 1124-3 and 1124-4, respectively, would all be at a high state during identification. Responsive to receiving high states on detect signals DT#0, DT#1, and DT#2, decoder 1135 outputs a high state on both ID<0> and ID<1>, which can be interpreted in this embodiment as ID#3.

By contrast, assuming the memory die corresponding to identification circuit 1120 is memory die 212-4 in stack 210 (wherein the detection circuits 1124 are float detection circuits), during identification, float detection circuit 1124-1 would output a detect signal DT#0 having a low state. This is because pad 1118-1 (which corresponds to pad 218-4-1 in this example) is floating in this embodiment. Likewise, float detection circuits 1124-2 and 1124-3 would also output detect signals, DT#1 and DT#2, respectively, having low states. This is because pads 1118-2 and 1118-3 in this example would correspond to pads 218-4-2 and 218-4-3, which are also floating in this example.

If included, float detection circuit 1124-4, on the other hand, would output a detect signal DT#3 having a high state. This is because pad 1118-4 in this embodiment would correspond to pad 218-4-4. Pad 218-4-4 is ultimately coupled to external chip-select connection node 214-1-1 in this arrangement. Responsive to receiving low states on detect signals DT#0, DT#1, and DT#2, decoder 1135 outputs a low state on both ID<0> and ID<1>, which can be interpreted in this embodiment as ID#0.

Continuing with an example based on the embodiment depicted in FIG. 2, the input impedance between an external chip-select connection node, such as node 214-1-1, and an input buffer 1130 on memory die 212-4 will likely be much larger than, for example, the input impedance between an external chip-select connection node, such as node 214-1-1, and an input buffer 1130 on memory die 212-1, where the input buffer 1130 has a reference voltage VREF. The impedance difference will likely not be negligible, since the parasitic impedance of a conventional TSV is not negligible.

Accordingly, in at least one embodiment, each memory die, such as memory die 212, may further include a delay circuit 1137. Delay circuit 1137 could be used in such an embodiment to, for example, adjust signal timing in the respective memory die 212 responsive to how that die is arranged in stack 210. For example, delay circuit 1137 could be coupled between the identification circuit 1120 of a die and an input buffer 1130 of that die. In at least one embodiment, delay circuit 1137 is further coupled to pad 1118-4 via a pass gate 1131 having a gate voltage $V_{GATE}$.

In the embodiment based on FIGS. 2 and 11, the chip select signal coupled to pad 1118-4 will effectively be the signal that selects the die 212 corresponding to the identification circuit 1120 (e.g., where the corresponding chip select signal is either CS#0, CS#1, CS#2 or CS#3, depending on how the die is arranged in the stack). Delay circuit 1137 can be configured to selectively delay that respective signal by an amount responsive to the determined identification (e.g., responsive to the state of identification signal ID<0> and the state of identification signal ID<1>), such as to account for the difference in input impedance depending upon the die's arrangement in a stack.

Figure 12:
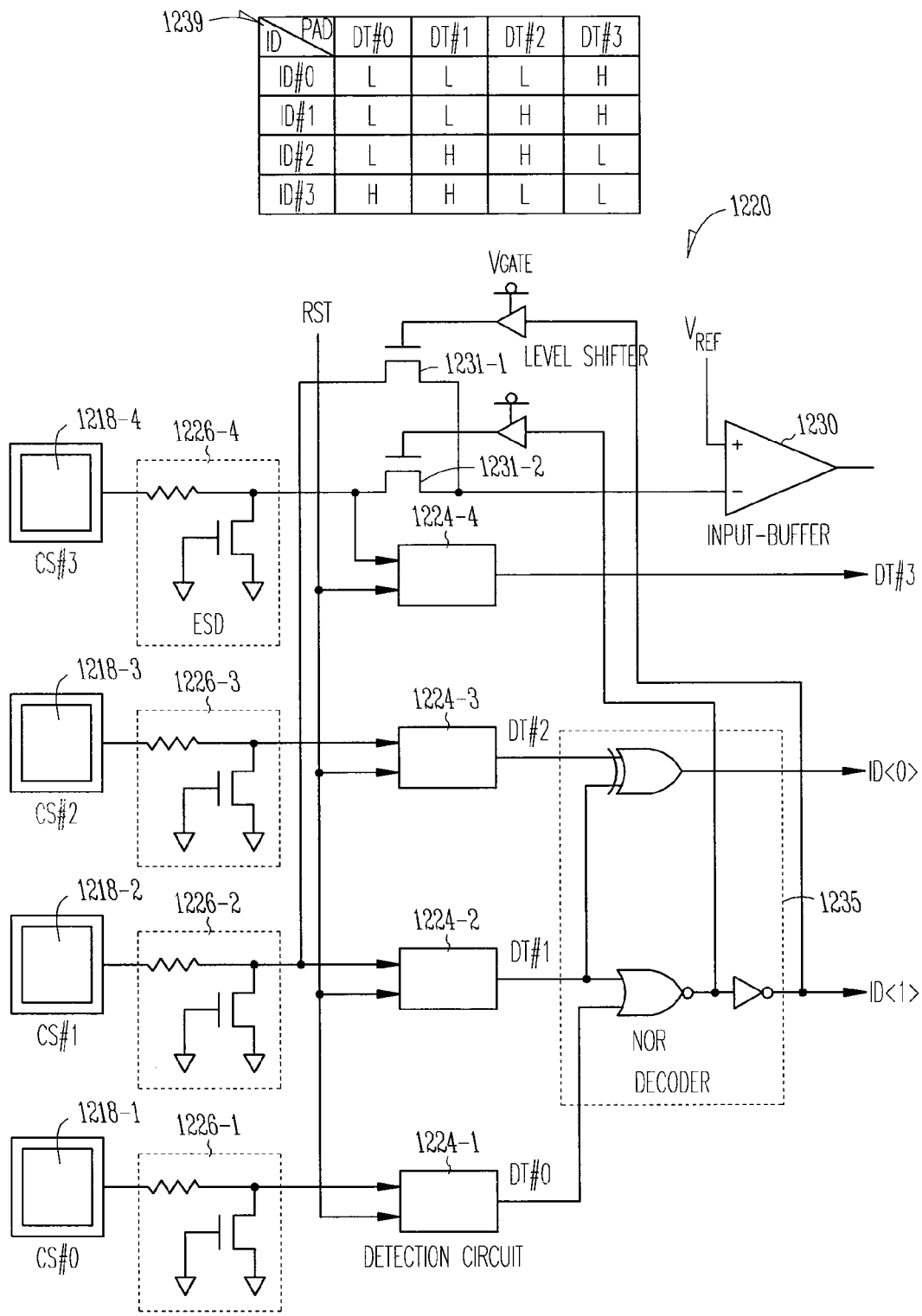
FIG. 12 shows a block diagram of an identification circuit for a memory die used in a stack of memory dies having a two chip-select specification, according to various example embodiments.

FIG. 12 shows a block diagram of an identification circuit 1220 for a memory die to be used in a stack of memory dies having a two chip-select specification, according to various example embodiments. Identification circuit 1220 includes a number of detection circuits, 1224-1 ... 1224-4, and a decoder 1235. The number of detection circuits 1224 and the structure of the decoder 1235 could vary, however, depending on, for example, the number of memory dies disposed in the stack of memory dies and/or the chip-select specification. For the non-limiting example embodiment shown in FIG. 12, identification circuit 1220 couples to four pads 1218-1 ... 1218-4 (via ESD circuits 1226-1 ... 1226-4, respectively).

An identification circuit, such as identification circuit 1220, is configured on each of the memory dies of the stack, and pads 1218-1 ... 1218-4 on each memory die can couple to chip-select related connection nodes of the stacked memory device. One or more of the chip-select related connection nodes are configured to be selectively coupled to a chip-select depending upon the arrangement of the respective die in the stack. Identification circuit 1220 can be used on each of the memory dies shown in FIG. 6, for example.

Detection circuits 1224-1 ... 1224-4 can each be configured as a float detection circuit, such as the float detection circuit 824 shown in FIG. 8. Alternatively, detection circuits 1224-1 ... 1224-4 can each be configured as a voltage detection circuit, such as the voltage detection circuit 924 shown in FIG. 9. As shown in FIG. 12, identification circuit 1220 includes detection circuits 1224-1 ... 1223-4. With each of these detections circuits being identical (although they receive an input from a different one of pads 1218-1 ... 1218-4 of the die), the fabrication can be simplified based on the uniformity of forming these circuits. As one of ordinary skill in the art can appreciate, however, in an alternative embodiment, identification circuit 1220 may not include detection circuit 1224-4, as DT#3 is not needed to identify the memory die in the scheme discussed below Assuming for purposes of this example that detection circuits 1224 are float detection circuits, the state of each respective detection signal DT#0, DT#1, DT#2 and DT#3 is determined responsive to whether a corresponding pad, 1218-1, 1218-2, 1218-3, or 1218-4, is floating or not. The output from detection circuits 1224-1 . . . 1223-3 are input to decoder 1235, which detects an identification of the respective memory die responsive to, in this example, signals DT#0, DT#1, and DT#2. The identification output in the illustrated embodiment is two binary identification signals, ID<0> and ID<1>. With four memory dies in a stacked memory device, the respective memory die could be identified as, for example, ID#0 (binary 00), ID#1 (binary 10), ID#2 (binary 01), or ID#3 (binary 11).

Input chart 1239 shows an example of identification determination responsive to how a die including identification circuit 1220 is arranged in a stack. For example, assuming the memory die corresponding to identification circuit 1220 is memory die 612-1 in stack 610 (wherein the detection circuits 1224 are float detection circuits), during identification, float detection circuit 1224-1 would output a detect signal DT#0 having a high state. This is because pad 1218-1 (which corresponds to pad 618-1-1 in this example) is coupled to external chip-select connection node 614-1-1, and therefore is not floating in this embodiment.

Pads 1218-2, 1218-3, and 1218-4 in this example would correspond to pads 618-1-2, 618-1-3, and 618-1-4, respectively. By reference to FIG. 6, pad 1218-2/618-1-2 is also coupled to an external chip-select connection node 614-1-2. Accordingly, pad 1218-2/618-1-2 is also not floating. Therefore, the detect signal DT#2 output by float detection circuits 1224-2 would also be in a high state.

Meanwhile, pads 1218-3/618-1-3 and 1218-4/618-1-4 are coupled to TSVs 616-1-3 and 616-1-4, respectively. TSVs 616-1-3 and 616-1-4 are not coupled to external chip-select connection nodes. Accordingly, pads 1218-3/618-1-3 and 1218-4/618-1-4 are floating. Therefore, the detect signals DT#2 and DT#3 output by float detection circuits 1224-3 and 1224-4, respectively, would all be at a low state during identification. Responsive to receiving high states on detect signals DT#0 and DT#1, and a low state on detect signal DT#2, decoder 1235 outputs a high state on both ID<0> and ID<1>. In this embodiment, high states on both ID<0> and ID<1> can be interpreted as ID#3.

By contrast, assuming the memory die corresponding to identification circuit 1220 is memory die 612-4 in stack 610 (wherein the detection circuits 1224 are float detection circuits), during identification, float detection circuit 1224-1 would output a detect signal DT#0 having a low state. This is because pad 1218-1 (which corresponds to pad 618-4-1 in this example) is floating in this embodiment. Likewise, float detection circuits 1224-2 and 1224-3 would also output detect signals, DT#1 and DT#2, respectively, having low states. This is because pads 1218-2 and 1218-3 in this example would correspond to pads 618-4-2 and 618-4-3, which are also floating in this example.

If included, float detection circuit 1224-4, on the other hand, would output a detect signal DT#3 having a high state. This is because pad 1218-4 in this embodiment would correspond to pad 618-4-4 in FIG. 6. Pad 618-4-4 is ultimately coupled to external chip-select connection node 614-1-1. Responsive to receiving low states on detect signals DT#0, DT#1, and DT#2, decoder 1235 outputs a low state on both ID<0> and ID<1>. In this embodiment, low states on both ID<0> and ID<1> can be interpreted as ID#0. ID<1> and its inverse can be applied as control signals for pass gates 1231-1 and 1231-2, respectively, to control input to input-buffer 1230.

Figure 13:
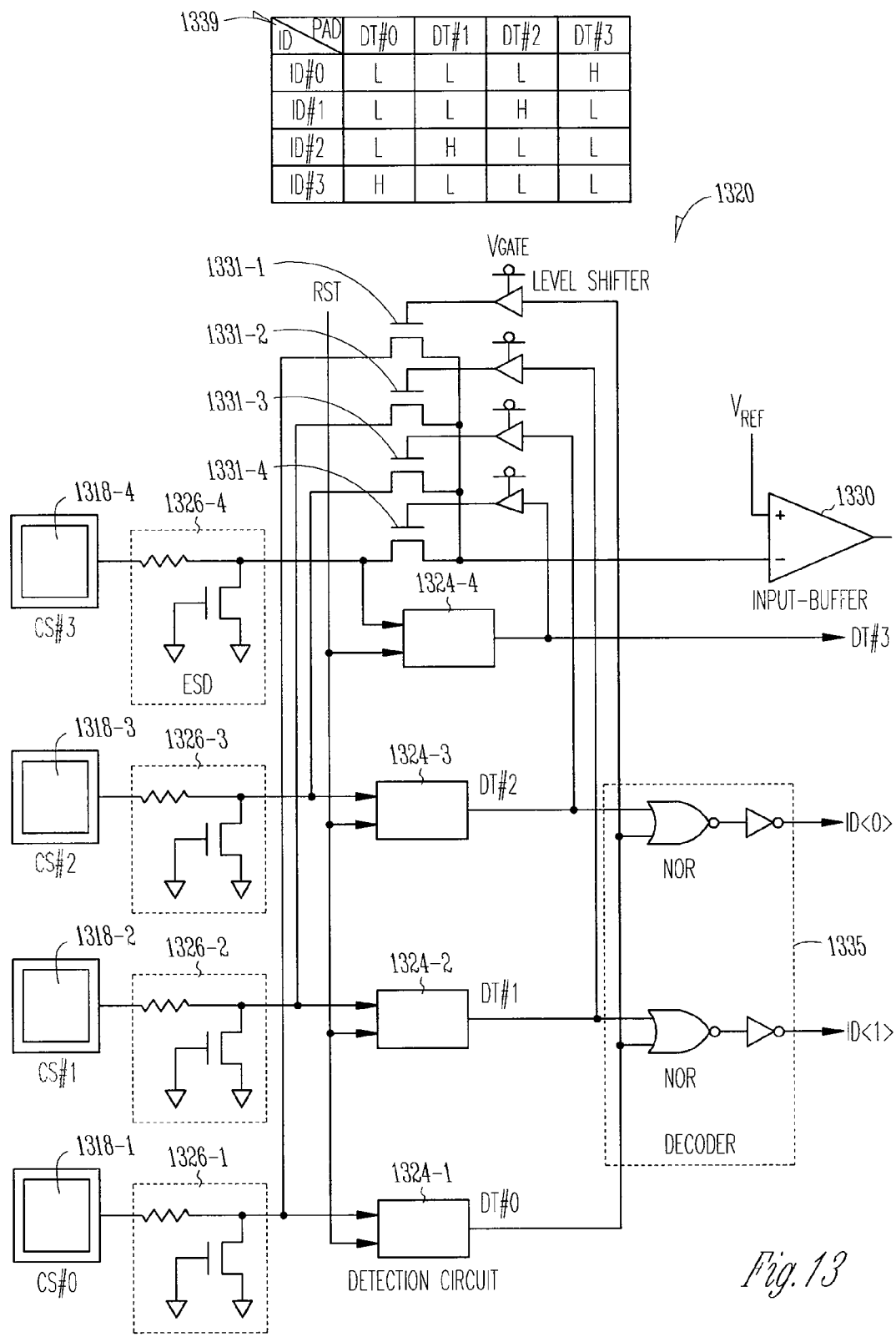
FIG. 13 shows a block diagram of an identification circuit for a memory die used in a stack of memory dies having a one chip-select specification, according to various example embodiments.

FIG. 13 shows a block diagram of an identification circuit 1320 for a memory die to be used in a stack of memory dies having a one chip-select specification, according to various example embodiments. Identification circuit 1320 includes a number of detection circuits, 1324-1 . . . 1324-4, and a decoder 1335. The number of detection circuits 1324 and the structure of the decoder 1335 could vary, however, depending on, for example, the number of memory dies disposed in the stack of memory dies and/or the chip-select specification. For the non-limiting example embodiment shown in FIG. 13, identification circuit 1320 couples to four pads 1318-1 . . . 1318-4 (via ESD circuits 1326-1 . . . 1326-4, respectively).

An identification circuit, such as circuit 1320, is configured on each of the memory dies of the stack, and pads 1318-1 . . . 1318-4 on each memory die can couple to chip-select related connection nodes of the stacked memory device. One chip-select related connection node per die is configured to be selectively coupled to a chip-select depending upon the arrangement of the respective die in the stack. Identification circuit 1320 can be used on each of the memory dies shown in FIG. 7, for example.

Detection circuits 1324-1 . . . 1324-4 can each be configured as a float detection circuit, such as the float detection circuit 824 shown in FIG. 8. Alternatively, detection circuits 1324-1 . . . 1324-4 can each be configured as a voltage detection circuit, such as the voltage detection circuit 924 shown in FIG. 9. As shown in FIG. 13, identification circuit 1320 includes detection circuits 1324-1 . . . 1323-4.

Assuming for purposes of this example that detection circuits 1324 are float detection circuits, the state of each respective detection signals DT#0, DT#1, DT#2 and DT#3 is determined responsive to whether a corresponding pad, 1318-1, 1318-2, 1318-3, or 1318-4, is floating or not. The output from detection circuits 1324-1 . . . 1323-3 are input to decoder 1335, which detects an identification of the respective memory die responsive to, in this example, signals DT#0, DT#1, and DT#2. The identification output in the illustrated embodiment is two binary identification signals, ID<0> and ID<1>. With four memory dies in a stacked memory device, the respective memory die could be identified as, for example, ID#0 (binary 00), ID#1 (binary 01), ID#2 (binary 10), or ID#3 (binary 11).

Input chart 1339 shows an example of identification determination responsive to how a die including identification circuit 1320 is arranged in a stack. For example, assuming the memory die corresponding to identification circuit 1320 is memory die 712-1 in stack 710 (wherein the detection circuits 1324 are float detection circuits), during identification, float detection circuit 1324-1 would output a detect signal DT#0 having a high state. This is because pad 1318-1 (which corresponds to pad 718-1-1 in this example) is coupled to external chip-select connection node 714-1-a, and therefore is not floating in this embodiment.

Pads 1318-2, 1318-3, and 1318-4 in this example would correspond to pads 718-1-2, 718-1-3, and 718-1-4, respectively. Pads 1318-2/718-1-2, 1318-3/718-1-3 and 1318-4/718-1-4 are non-connect nodes in that they are coupled to TSVs 716-1-2 716-1-3 and 716-1-4, respectively. TSVs 716-1-2, 716-1-3 and 716-1-4 are not coupled to an external chip-select connection node. Accordingly, pads 1318-2/718-1-2, 1318-3/718-1-3 and 1318-4/718-1-4 are floating. Therefore, the detect signals DT#1, DT#2 and DT#3 output by float detection circuits 1324-2, 1324-3 and 1324-4, respectively, would all be at a low state during identification. Responsive to receiving a high state on detect signals DT#0, and a low state on each of detect signals DT#1 and DT#2, decoder 1235 outputs a high state on both ID<0> and ID<1>. In this embodiment, high states on both ID<0> and ID<1> can be interpreted as ID#3.

By contrast, assuming the memory die corresponding to identification circuit 1320 is memory die 712-4 in stack 710 (wherein the detection circuits 1324 are float detection circuits), during identification, float detection circuit 1324-1 would output a detect signal DT#0 having a low state. This is because pad 1318-1 (which corresponds to pad 718-4-1 in this example) is floating in this embodiment. Likewise, float detection circuits 1324-2 and 1324-3 would also output detect signals, DT#1 and DT#2, respectively, having low states. This is because pads 1318-2 and 1318-3 in this example would correspond to pads 718-4-2 and 718-4-3, which are also floating in this example.

Float detection circuit 1324-4, on the other hand, would output a detect signal DT#3 having a high state. This is because pad 1318-4 in this embodiment would correspond to pad 718-4-4 in FIG. 7. Pad 718-4-4 is ultimately coupled to external chip-select connection node 714-1-1. Responsive to receiving low states on detect signals DT#0, DT#1, and DT#2, decoder 1235 outputs a low state on both ID<0> and ID<1>. Detection signals DT#0, DT#1, DT#2, and DT#3 output from detection circuits 1324-1 . . . 1323-4, respectively, can be applied as control signals for pass gates 1331-1, 1331-2, 1331-3, and 1331-4, respectively, to control input to input-buffer 1330.

Figure 14:
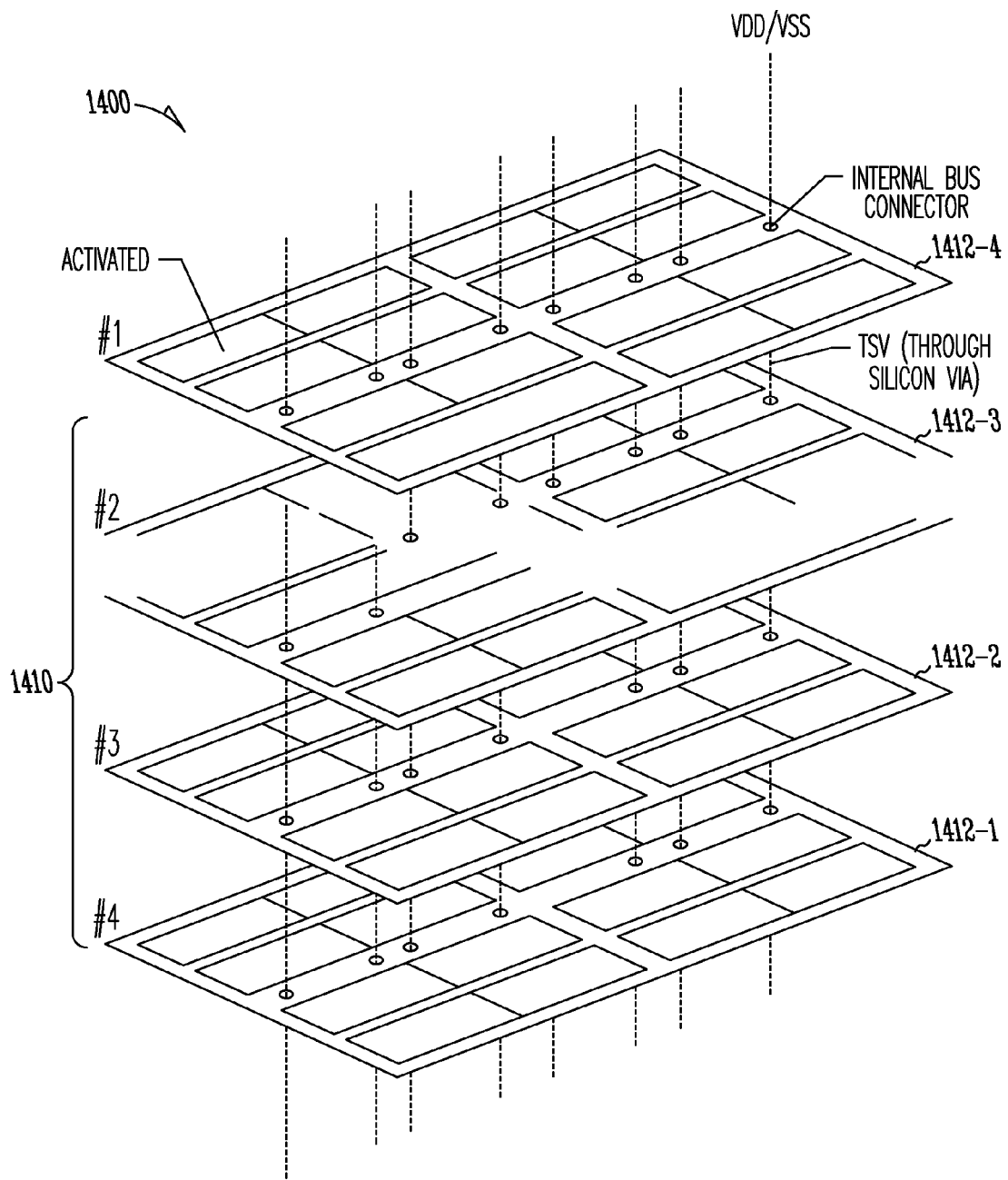
FIG. 14 shows an activated area of a memory die in a stack of memory dies at refresh, according to various example embodiments.

FIG. 14 shows an activated area of a memory die in a stack 1410 of memory dies 1412-1 . . . 1412-4 at refresh, according to various example embodiments. In a conventional case of stacked memory devices, each memory device of the stack has the same memory map, but does not have ID information. When a refresh operation is performed on the stack, the same memory area is activated at the same time so that its activation current flows into the specified power-bus and power-supply pads. Therefore, power-supply noise is increased by its current concentration, especially in multiple devices. However, using memory mapping and ID information in memory device 1400, the refresh current in memory device 1400 can be distributed in other power-supply pads and power-bus so that the current concentration in the activated area is avoided and power-supply noise is reduced.

Figure 15:
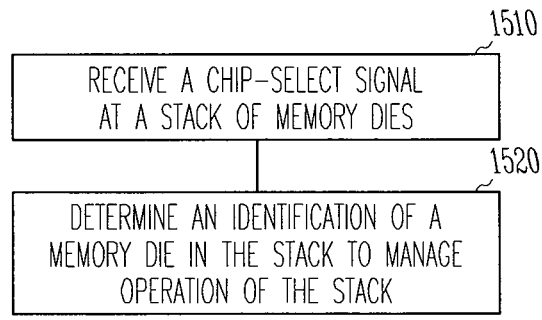
FIG. 15 shows features of an embodiment of a method to manage a stack of memory dies, according to various embodiments.

FIG. 15 shows features of an embodiment of a method to manage a stack of memory dies, according to various embodiments. At 1510, a chip-select signal(s) is received at a stack of memory dies. At 1520, an identification of a memory die in the stack is determined to manage operation of the stack. The determination of the identification conducted on the memory die can be responsive to how the die is coupled to receive the chip-select signal(s). In a process to determine the identification of the memory die, a reset signal can be applied to set, on a trailing edge of a reset signal, a detection signal that is input to a decoder on the memory die. Output from the decoder or the detection signal can be directed to provide a control signal to drive an input buffer for chip-select of the memory die. The identification can be used to adjust a delay of external input/output bus to which the memory stack is couple. The identification can be used to automatically switch memory mapping.

Figure 16:
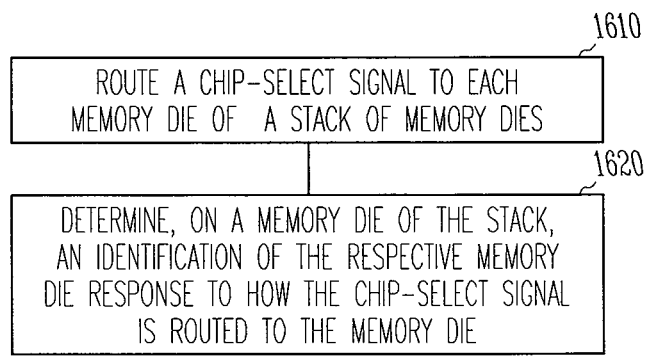
FIG. 16 shows features of an embodiment of a method to identify a memory die in a stack of memory dies, according to various embodiments.

FIG. 16 shows features of an embodiment of a method to identify a memory die in a stack of memory dies, according to various embodiments. At 1610, a chip-select signal(s) is routed to each memory die of a stack of memory dies. At 1620, on a memory die of the stack, an identification of the respective memory die is determined responsive to how the chip-select is routed to that die. Routing chip-select signals can include routing a number of chip-select signals received at the stack, where the number of chip-select signals is equal to the number of memory dies in the stack. In a process to determine the identification of the memory die, a reset signal can be applied to set a detection signal input to a decoder on the memory die. The identification can be used to automatically switch memory mapping.

Figure 17:
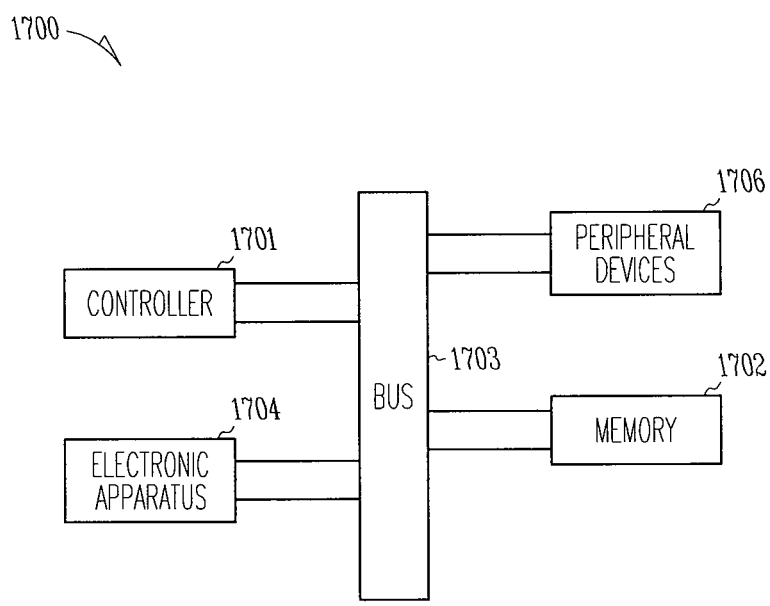
FIG. 17 shows a block diagram of various features of an electronic system, according to various embodiments of the invention.

FIG. 17 shows a block diagram of various features of an electronic system 1700, according to various embodiments of the invention. System 1700 can include a controller 1701 and a memory device 1702. Memory device 1702 can be configured as a stack of memory dies, in accordance with embodiments taught herein, and may be similar to or identical to one or more of the embodiments discussed with respect to FIGS. 1-16. System 1700 may be formed in various ways such as coupling the individual components of system 1700 together or integrating the components into one or a number of chip-based units using conventional techniques. In an embodiment, system 1700 also includes an electronic apparatus 1704 and a bus 1703, where bus 1703 provides electrical conductivity among the components of system 1700. In an embodiment, bus 1703 includes an address bus, a data bus, and a control bus, each independently configured. In an alternative embodiment, bus 1703 uses common conductive lines for providing one or more of address, data, or control, the use of which is regulated by controller 1701. In an embodiment, electronic apparatus 1704 may include additional memory for the intended functional applications of electronic system 1700.

With memory 1702 arranged as a stack of memory dies, the types of memory dies may include, but are not limited to, dynamic random access memory, static random access memory, synchronous dynamic random access memory (SDRAM), synchronous graphics random access memory (SGRAM), double data rate dynamic ram (DDR), and double data rate SDRAM, arranged according to the various embodiments as taught herein. Structures of various embodiments of stacked memory device 1702, in accordance with various embodiments as illustrated in FIGS. 1-16, may be realized in simulation packages that may be arranged as software, hardware, or a combination of software and hardware packages to simulate various embodiments and/or the operation of various embodiments.

In various embodiments, peripheral device or devices 1706 are coupled to bus 1703. Peripheral devices 1706 may include displays, imaging devices, printing devices, wireless devices, wireless interfaces (e.g. wireless transceivers), additional storage memory, control devices that may operate in conjunction with controller 1701. In an embodiment, controller 1701 can include one or more processors. In various embodiments, system 1700 includes, but is not limited to, fiber optic systems or devices, electro-optic systems or devices, optical systems or devices, imaging systems or devices, and information handling systems or devices such as wireless systems or devices, telecommunication systems or devices, and computers.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A method comprising:
receiving a select signal by a memory die in a stack of memory dies, the select signal being configured to manage operation of the stack, wherein the memory die has chip-select nodes, wherein the signal is received by an external chip-select node of the memory die;

transmitting the select signal from the chip-select nodes to an identification circuit of the memory die, wherein each memory die has the corresponding identification circuit configured to determine an identification of its respective memory die; and identifying the memory die responsive to how the identification circuit of the memory die is coupled to receive the select signal from the chip-select nodes of the memory die, wherein the chip-select nodes on one memory die are routed to the chip-select nodes on another memory die by routing which is separate from a location of the identification circuits.

2. The method of claim 1, further including using the identification to adjust a delay of a delay circuit.

3. The method of claim 1, further including using the identification to automatically switch memory mapping.

4. The method of claim 1, further including using memory mapping and identification information in the stack such that a refresh current in the stack is distributed in power-supply pads and a power-bus such that a current concentration in an activated area in the stack is avoided and power-supply noise is reduced.

5. The method of claim 1 wherein identifying the memory die includes applying a reset signal to set a detection signal on a trailing edge of the reset signal, the detection signal input provided to a decoder on the memory die.

6. The method of claim 5, wherein identifying the memory die includes directing an output from the decoder to provide a control signal to an input buffer for the memory die.

7. The method of claim 1, further including connecting a peripheral device to the memory stack by a bus.

8. The method of claim 1 wherein the memory dies in the stack are essentially same product.

9. The method of claim 1, further including interconnecting the memory dies in the stack with through-silicon vias (TSVs).

10. The method of claim 1 wherein the identification circuit has a floating input.

11. The method of claim 10, further including outputting a detect signal having a low state through the identification circuit.

12. A method comprising:

routing a select signal to chip-select nodes of memory dies of a stack of the memory dies, wherein the select signal is received by an external chip-select node of the memory die;

transmitting the select signal from the chip-select nodes to an identification circuit of the memory die, wherein each memory die has the corresponding identification circuit configured to determine an identification of its respective memory die; and determining, on a memory die of the stack, an identification of the respective memory die responsive to how the select signal is routed to the identification circuit of the memory die from chip-select nodes to the memory die, wherein the chip-select nodes on one memory die are routed to chip select nodes on another memory die by routing which is separate from a location of the identification circuits.

13. The method of claim 12, further including using the identification to automatically switch memory mapping.

14. The method of claim 12, wherein determining the identification of the respective memory die includes applying a reset signal to set a detection signal input to a decoder on the memory die.

15. The method of claim 12 wherein routing the select signal includes routing a number of select signals received at the stack, the number of select signals equal to the number of memory dies in the stack.

16. The method of claim 12 wherein routing the select signal includes routing a number of select signals received at the stack.

17. The method of claim 12, further including connecting an electronic apparatus to the memory stack by a bus.

18. The method of claim 1, further including interconnecting the memory dies in the stack with through-silicon vias (TSVs).

* * * * *

UNITED STATES PATENT AND TRADEMARK OFFICE
CERTIFICATE OF CORRECTION

PATENT NO. : 8,717,796 B2  
APPLICATION NO. : 13/860161  
DATED : May 6, 2014  
INVENTOR(S) : Takuya Nakanishi et al.

Page 1 of 1

It is certified that error appears in the above-identified patent and that said Letters Patent is hereby corrected as shown below:

In the Claims

In column 19, line 1, in Claim 1, delete "the" and insert -- the select --, therefor.

In column 19, line 30, in Claim 6, delete "claim 5," and insert -- claim 5 --, therefor.

In column 20, line 18, in Claim 12, delete "from" and insert -- from the --, therefor.

In column 20, line 20, in Claim 12, delete "to" and insert -- to the --, therefor.

In column 20, line 25, in Claim 14, delete "claim 12," and insert -- claim 12 --, therefor.

Signed and Sealed this  
Nineteenth Day of August, 2014

Michelle K. Lee  
*Deputy Director of the United States Patent and Trademark Office*